United States Patent
Rothberg et al.

(10) Patent No.: US 10,272,470 B2
(45) Date of Patent: *Apr. 30, 2019

(54) CMOS ULTRASONIC TRANSDUCERS AND RELATED APPARATUS AND METHODS

(71) Applicant: Butterfly Network, Inc., Guilford, CT (US)

(72) Inventors: Jonathan M. Rothberg, Guilford, CT (US); Keith G. Fife, Palo Alto, CA (US); Tyler S. Ralston, Clinton, CT (US); Gregory L. Charvat, Guilford, CT (US); Nevada J. Sanchez, Guilford, CT (US)

(73) Assignee: Butterfly Network, Inc., Guilford, CT (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/581,511

(22) Filed: Apr. 28, 2017

(65) Prior Publication Data

US 2017/0225196 A1    Aug. 10, 2017

Related U.S. Application Data

(63) Continuation of application No. 15/158,968, filed on May 19, 2016, now Pat. No. 9,718,098, which is a
(Continued)

(51) Int. Cl.
*B06B 1/02* (2006.01)
*B81B 3/00* (2006.01)
(Continued)

(52) U.S. Cl.
CPC .............. *B06B 1/02* (2013.01); *B06B 1/0292* (2013.01); *B81B 3/0021* (2013.01);
(Continued)

(58) Field of Classification Search
USPC ........................................................... 438/51
See application file for complete search history.

(56) References Cited

U.S. PATENT DOCUMENTS

| 5,286,671 A | 2/1994 | Kurtz et al. |
| 6,430,109 B1 | 8/2002 | Khuri-Yakub et al. |

(Continued)

FOREIGN PATENT DOCUMENTS

| CN | 101640834 A | 2/2010 |
| EP | 2 441 530 A2 | 4/2012 |

(Continued)

OTHER PUBLICATIONS

International Search Report and Written Opinion dated Jul. 1, 2014 for Application No. PCT/US2014/014705.
(Continued)

*Primary Examiner* — Thao X Le
*Assistant Examiner* — Lawrence C Tynes, Jr.
(74) *Attorney, Agent, or Firm* — Wolf, Greenfield & Sacks, P.C.

(57) ABSTRACT

CMOS Ultrasonic Transducers and processes for making such devices are described. The processes may include forming cavities on a first wafer and bonding the first wafer to a second wafer. The second wafer may be processed to form a membrane for the cavities. Electrical access to the cavities may be provided.

14 Claims, 22 Drawing Sheets

Related U.S. Application Data continuation of application No. 14/172,383, filed on Feb. 4, 2014, now Pat. No. 9,499,392.

(60) Provisional application No. 61/760,932, filed on Feb. 5, 2013, provisional application No. 61/760,968, filed on Feb. 5, 2013, provisional application No. 61/760,951, filed on Feb. 5, 2013, provisional application No. 61/760,891, filed on Feb. 5, 2013.

(51) Int. Cl.
| | |
|---|---|
| *B81C 1/00* | (2006.01) |
| *B81B 7/00* | (2006.01) |
| *G10K 9/12* | (2006.01) |
| *G10K 11/18* | (2006.01) |

(52) U.S. Cl.
CPC ........ *B81B 7/0077* (2013.01); *B81C 1/00158* (2013.01); *G10K 9/12* (2013.01); *G10K 11/18* (2013.01); *B81B 2203/0127* (2013.01); *B81B 2203/0315* (2013.01); *B81B 2207/015* (2013.01); *B81C 2201/013* (2013.01); *B81C 2203/0118* (2013.01); *B81C 2203/0735* (2013.01); *B81C 2203/0771* (2013.01)

(56) References Cited

U.S. PATENT DOCUMENTS

| | | |
|---|---|---|
| 6,443,901 B1 | 9/2002 | Fraser |
| 6,645,145 B1 | 11/2003 | Dreschel et al. |
| 6,659,954 B2 | 12/2003 | Robinson |
| 6,694,817 B2 | 2/2004 | Degertekin et al. |
| 6,795,374 B2 | 9/2004 | Barnes et al. |
| 6,779,387 B2 | 10/2004 | Pippins |
| 6,831,394 B2 | 12/2004 | Baumgartner et al. |
| 6,865,140 B2 | 3/2005 | Thomenius et al. |
| 6,958,255 B2 | 10/2005 | Khuri-Yakub et al. |
| 7,030,536 B2 | 4/2006 | Smith et al. |
| 7,037,746 B1 | 5/2006 | Smith et al. |
| 7,052,464 B2 | 5/2006 | Wodnicki |
| 7,104,129 B2 | 9/2006 | Nasiri et al. |
| 7,125,383 B2 | 10/2006 | Hoctor et al. |
| 7,247,246 B2 | 7/2007 | Nasiri et al. |
| 7,250,353 B2 | 7/2007 | Nasiri et al. |
| 7,257,051 B2 | 8/2007 | Thomenius et al. |
| 7,285,897 B2 | 10/2007 | Fisher et al. |
| 7,312,440 B2 | 12/2007 | Degertekin et al. |
| 7,313,053 B2 | 12/2007 | Wodnicki |
| 7,375,420 B2 | 5/2008 | Fisher et al. |
| 7,441,321 B2 | 10/2008 | Baumgartner et al. |
| 7,441,447 B2 | 10/2008 | Degertekin et al. |
| 7,442,570 B2 | 10/2008 | Nasiri et al. |
| 7,451,651 B2 | 11/2008 | Woychik et al. |
| 7,518,251 B2 | 4/2009 | Fisher et al. |
| 7,530,952 B2 | 5/2009 | Huang et al. |
| 7,545,012 B2 | 6/2009 | Smith et al. |
| 7,557,342 B2 | 7/2009 | Federov et al. |
| 7,564,172 B1 | 7/2009 | Huang |
| 7,612,483 B2 | 11/2009 | Degertekin |
| 7,612,635 B2 | 11/2009 | Huang |
| 7,615,834 B2 | 11/2009 | Khuri-Yakub et al. |
| 7,622,848 B2 | 11/2009 | Lee et al. |
| 7,637,149 B2 | 12/2009 | Degertekin et al. |
| 7,646,133 B2 | 1/2010 | Degertekin |
| 7,687,976 B2 | 3/2010 | Haider et al. |
| 7,745,248 B2 | 6/2010 | Park et al. |
| 7,759,839 B2 | 7/2010 | Huang |
| 7,764,003 B2 | 7/2010 | Huang |
| 7,779,696 B2 | 8/2010 | Huang |
| 7,846,102 B2 | 12/2010 | Kupnik et al. |
| 7,878,977 B2 | 2/2011 | Mo et al. |
| 7,880,565 B2 | 2/2011 | Huang |
| 7,888,709 B2 | 2/2011 | Lemmerhirt et al. |
| 7,892,176 B2 | 2/2011 | Wodnicki et al. |
| 7,956,510 B2 | 6/2011 | Huang |
| 8,004,373 B2 | 8/2011 | Huang |
| 8,008,105 B2 | 8/2011 | Huang |
| 8,008,835 B2 | 8/2011 | Degertekin |
| 8,018,301 B2 | 9/2011 | Huang |
| 8,076,821 B2 | 12/2011 | Degertekin |
| 8,105,941 B2 | 1/2012 | Huang |
| 8,120,229 B2 | 2/2012 | Huang |
| 8,203,912 B2 | 6/2012 | Roest et al. |
| 8,222,065 B1 | 7/2012 | Smeys et al. |
| 8,241,931 B1 | 8/2012 | Antoine et al. |
| 8,247,945 B2 | 8/2012 | Huang |
| 8,277,380 B2 | 10/2012 | Daft et al. |
| 8,309,428 B2 | 11/2012 | Lemmerhirt et al. |
| 8,315,125 B2 | 11/2012 | Lemmerhirt et al. |
| 8,327,521 B2 | 12/2012 | Dirksen et al. |
| 8,334,133 B2 | 12/2012 | Federov et al. |
| 8,345,508 B2 | 1/2013 | Wodnicki et al. |
| 8,345,513 B2 | 1/2013 | Huang |
| 8,363,514 B2 | 1/2013 | Huang |
| 8,372,011 B2 | 2/2013 | Degertekin |
| 8,398,554 B2 | 3/2013 | Degertekin |
| 8,399,278 B2 | 3/2013 | Lemmerhirt et al. |
| 8,402,831 B2 | 3/2013 | Kupnik et al. |
| 8,429,808 B2 | 4/2013 | Huang |
| 8,451,693 B2 | 5/2013 | Nikoozadeh et al. |
| 8,483,014 B2 | 7/2013 | Huang |
| 8,526,271 B2 | 9/2013 | Huang |
| 8,559,274 B2 | 10/2013 | Huang |
| 8,563,345 B2 | 10/2013 | Adler et al. |
| 8,564,076 B1 | 10/2013 | Huang et al. |
| 8,587,078 B2 | 11/2013 | Huang et al. |
| 8,647,279 B2 | 2/2014 | Daft et al. |
| 8,658,453 B2 | 2/2014 | Lemmerhirt et al. |
| 8,665,672 B2 | 3/2014 | Soeda et al. |
| 8,957,564 B1 | 2/2015 | Hiroe et al. |
| 9,061,318 B2 | 6/2015 | Rothberg et al. |
| 9,067,779 B1 | 6/2015 | Rothberg et al. |
| 9,242,275 B2 | 1/2016 | Rothberg et al. |
| 9,290,375 B2 | 3/2016 | Rothberg et al. |
| 9,394,162 B2 | 7/2016 | Rothberg et al. |
| 9,499,392 B2 | 11/2016 | Rothberg et al. |
| 9,499,395 B2 | 11/2016 | Rothberg et al. |
| 9,505,030 B2 | 11/2016 | Rothberg et al. |
| 9,533,873 B2 | 1/2017 | Rothberg et al. |
| 9,718,098 B2 * | 8/2017 | Rothberg .............. B81B 3/0021 |
| 9,738,514 B2 | 8/2017 | Rothberg et al. |
| 9,895,718 B2 | 2/2018 | Rothberg et al. |
| 9,899,371 B2 | 2/2018 | Rothberg et al. |
| 9,910,017 B2 | 3/2018 | Rothberg et al. |
| 9,910,018 B2 | 3/2018 | Rothberg et al. |
| 9,944,514 B2 | 4/2018 | Rothberg et al. |
| 2005/0075572 A1 | 4/2005 | Mills et al. |
| 2005/0121734 A1 | 6/2005 | Degertekin et al. |
| 2005/0177045 A1 | 8/2005 | Degertekin et al. |
| 2005/0203397 A1 | 9/2005 | Degertekin |
| 2005/0248232 A1 | 11/2005 | Itaya et al. |
| 2006/0116585 A1 | 6/2006 | Nguyen et al. |
| 2006/0179640 A1 | 8/2006 | Machida et al. |
| 2007/0167811 A1 | 7/2007 | Lemmerhirt et al. |
| 2007/0167812 A1 | 7/2007 | Lemmerhirt et al. |
| 2007/0180916 A1 | 8/2007 | Tian et al. |
| 2007/0190680 A1 | 8/2007 | Fukuda et al. |
| 2007/0215964 A1 | 9/2007 | Khuri-Yakub et al. |
| 2007/0262436 A1 | 11/2007 | Kweon et al. |
| 2008/0138922 A1 | 6/2008 | Wan |
| 2008/0194053 A1 | 8/2008 | Huang |
| 2008/0290756 A1 | 11/2008 | Huang |
| 2008/0296708 A1 | 12/2008 | Wodnicki et al. |
| 2008/0308920 A1 | 12/2008 | Wan |
| 2009/0122651 A1 | 5/2009 | Kupnik et al. |
| 2009/0133820 A1 | 5/2009 | Sato et al. |
| 2009/0134497 A1 | 5/2009 | Barth et al. |
| 2009/0148967 A1 | 6/2009 | Wodnicki et al. |
| 2009/0176375 A1 | 7/2009 | Benson et al. |
| 2009/0250729 A1 | 10/2009 | Lemmerhirt et al. |
| 2010/0027830 A1 | 2/2010 | Hsu et al. |
| 2010/0171153 A1 | 7/2010 | Yang |

(56) References Cited

U.S. PATENT DOCUMENTS

| | | |
|---|---|---|
| 2010/0225200 A1* | 9/2010 | Kupnik ............... B06B 1/0292 310/300 |
| 2010/0254222 A1 | 10/2010 | Huang |
| 2011/0055447 A1 | 3/2011 | Costa |
| 2011/0084570 A1 | 4/2011 | Soeda et al. |
| 2011/0115333 A1 | 5/2011 | Ezaki |
| 2011/0140224 A1 | 6/2011 | Kropelnicki et al. |
| 2011/0272693 A1 | 11/2011 | Kobayashi et al. |
| 2012/0074509 A1 | 3/2012 | Berg et al. |
| 2012/0091543 A1 | 4/2012 | Torashima et al. |
| 2012/0129301 A1 | 5/2012 | Or-Bach et al. |
| 2012/0187508 A1 | 7/2012 | Adler et al. |
| 2012/0248554 A1 | 10/2012 | Klein et al. |
| 2013/0087867 A1 | 4/2013 | Ho et al. |
| 2013/0096433 A1 | 4/2013 | Lemmerhirt et al. |
| 2013/0116561 A1 | 5/2013 | Rothberg et al. |
| 2013/0161702 A1 | 6/2013 | Chen |
| 2013/0169110 A1 | 7/2013 | Jeong et al. |
| 2013/0175643 A1 | 7/2013 | Berthelot et al. |
| 2014/0054730 A1 | 2/2014 | Graham et al. |
| 2014/0057382 A1* | 2/2014 | Supino ............... B81C 1/00619 438/50 |
| 2014/0217478 A1 | 8/2014 | Rothberg et al. |
| 2014/0219062 A1 | 8/2014 | Rothberg et al. |
| 2014/0264660 A1 | 9/2014 | Rothberg et al. |
| 2014/0355381 A1 | 12/2014 | Lal et al. |
| 2015/0084053 A1 | 3/2015 | Rothberg et al. |
| 2015/0251896 A1 | 9/2015 | Rothberg et al. |
| 2015/0298170 A1 | 10/2015 | Rothberg et al. |
| 2016/0009544 A1 | 1/2016 | Rothberg et al. |
| 2016/0009549 A1 | 1/2016 | Rothberg et al. |
| 2016/0207760 A1 | 7/2016 | Rothberg et al. |
| 2016/0264400 A1 | 9/2016 | Rothberg et al. |
| 2016/0280538 A1 | 9/2016 | Rothberg et al. |
| 2016/0290969 A1 | 10/2016 | Rothberg et al. |
| 2016/0290970 A1 | 10/2016 | Rothberg et al. |
| 2016/0379973 A1 | 12/2016 | Rothberg et al. |
| 2017/0029271 A1 | 2/2017 | Rothberg et al. |
| 2017/0056926 A1 | 3/2017 | Rothberg et al. |
| 2017/0283254 A1 | 10/2017 | Rothberg et al. |
| 2017/0315099 A1 | 11/2017 | Rothberg et al. |
| 2018/0003678 A1 | 1/2018 | Rothberg et al. |
| 2018/0130795 A1 | 5/2018 | Rothberg et al. |
| 2018/0133756 A1 | 5/2018 | Rothberg et al. |
| 2018/0186628 A1 | 7/2018 | Rothberg et al. |

FOREIGN PATENT DOCUMENTS

| | | |
|---|---|---|
| GB | 2 467 776 A | 8/2010 |
| JP | 2005-103294 A | 4/2005 |
| JP | 2006-211185 A2 | 8/2006 |
| JP | 2007-215177 A2 | 8/2007 |
| JP | 2011-522444 T2 | 7/2011 |
| JP | 2012-085239 A2 | 4/2012 |
| JP | 2012-519958 T2 | 8/2012 |
| KR | 10-2013-0134724 A | 12/2013 |
| WO | WO 2009/073562 A1 | 6/2009 |
| WO | WO 2009/107940 A2 | 9/2009 |
| WO | WO 2012/017978 A2 | 2/2012 |
| WO | WO 2014/151525 A2 | 9/2014 |

OTHER PUBLICATIONS

Invitation to Pay Additional Fees dated Nov. 6, 2014 for Application No. PCT/US2014/025924.
International Search Report and Written Opinion dated Feb. 18, 2015 for Application No. PCT/US2014/025924.
International Preliminary Report on Patentability dated Aug. 20, 2015 for Application No. PCT/US2014/014705.
International Preliminary Report on Patentability dated Sep. 24, 2015 for Application No. PCT/US2014/025924.
International Search Report and Written Opinion dated Jun. 29, 2015 for Application No. PCT/US2015/026290.
International Preliminary Report on Patentability dated Oct. 27, 2016 for Application No. PCT/US2015/026290.
International Search Report and Written Opinion dated Oct. 29, 2015 for Application No. PCT/US2015/040342.
Office Communication dated Jul. 12, 2016 for U.S. Appl. No. 14/172,840.
Office Communication dated May 21, 2015 for U.S. Appl. No. 14/208,351.
Notice of Allowance dated Sep. 14, 2015 for U.S. Appl. No. 14/208,351.
Office Communication dated Apr. 3, 2015 for U.S. Appl. No. 14/561,384.
Office Communication dated May 15, 2015 for U.S. Appl. No. 14/635,197.
Notice of Allowance dated Nov. 10, 2015 for U.S. Appl. No. 14/711,145.
[No Author Listed], Sil-Via, TSI & Advanced Features. Silex Microsystems. http://www.silexmicrosystems.com/mems-foundry/sil-via-tsi-advanced-features/ [last accessed Jan. 6, 2015]. 4 pages.
Calmes et al., Highly Integrated 2-D Capacitive Micromachined Ultrasonic Transducers. 1999 IEEE Ultrason Symp. 1999;1163-6.
Cha et al., Influences of perforation ratio in characteristics of capacitive micromachined ultrasonic transducers in air. Sensors Actuators A. 2011;171:191-8.
Cheng et al., An Efficient Electrical Addressing Method Using Through-Wafer Vias for Two-Dimensional Ultrasonic Arrays. 2000 IEEE Ultrasonics Symposium. 2000;2:1179-82.
Cheng et al., Electrical Through-Wafer Interconnects with Sub-PicoFarad Parasitic Capacitance. 2001 Microelectromechan Syst Conf. Aug. 24, 2001;18-21.
Daft et al., Microfabricated ultrasonic transducers monolithically integrated with high voltage electronics. Proc Ultrason Symp. 2004;493-6.
Dixon-Warren, Overview of MEMS microphone technologies for consumer applications. MEMS J. Mar. 8, 2011. http://www.memsjournal.com/2011/03/overview-of-mems-microphone-technologies-for-consumer-applications.html [last accessed Feb. 19, 2014]. 10 pages.
Doody et al., Modeling and Characterization of CMOS-Fabricated Capacitive Micromachined Ultrasound Transducers. J Microelectromech Sys. Feb. 1, 2011;20(1):104-18.
Eccardt et al., Micromachined ultrasound transducers with improved coupling factors from a CMOS compatible process. Ultrasonics. Mar. 2000;38:774-80.
Eccardt et al., Surface micromachined ultrasound transducer in CMOS technology. Proc Ultrason Symp. 1996;959-62.
Gurun et al., Front-end CMOS electronics for monolithic integration with CMUT arrays: circuit design and initial experimental results. Proc Ultrason Symp. 2008;390-3.
Helin et al., Poly-SiGe-based CMUT array with high acoustical pressure. MEMS. 2012 IEEE 25th International Conference on Micro Electro Mechanical Systems. Jan. 29, 2012;305-8.
Kim et al., Design and Test of a Fully Controllable 64×128 2-D CMUT Array Integrated with Reconfigurable Frontend ASICs for Volumetric Ultrasound Imaging. IEEE. International Ultrasonics Symposium Proceedings. Oct. 7-10, 2012;77-80. doi: 10.1109/ULTSYM.2012.0019.
Knight et al., Low Temperature Fabrication of Immersion Capacitive Micromachined Ultrasonic Transducers on Silicon and Dielectric Substrates. IEEE Trans Ultrason Ferroelectr Freq Contr. Oct. 2004;51(10):1324-33.
Kupnik et al., CMUT Fabrication Based on a Thick Buried Oxide Layer. Proc IEEE Ultrason Symp. Oct. 2010;2010:547-550. doi:10.1109/ULTSYM.2010.5935935. Epub Jun. 8, 2012. 10 pages.
Kupnik et al., Wafer-Bonded CMUT Meets CMOS. 2010 CMOS Emerging Technology Workshop. May 21, 2010;1-22.
Lemmerhirt et al., A 32 × 32 capacitive micromachined ultrasonic transducer array manufactured in standard CMOS. IEEE Trans Ultrason Ferroelectr Freq Control. Jul. 2012;59(7):1521-36. doi: 10.1109/TUFFC.2012.2352.
Lemmerhirt et al., An electronically-scanned CMUT-in-CMOS transducer for hemodialysis vascular access monitoring. Ultrason Symp. 2011 IEEE International Conference. Oct. 18, 2011;2193-6.

(56) References Cited

OTHER PUBLICATIONS

Lin et al., Packaging of Large and Low-Pitch Size 2D Ultrasonic Transducer Arrays. MEMS Conf. 2010;508-11.
Lu et al., Investigation of thermal stress influence on CMUT in standard CMOS process. Info Auto. 2009 ICIA International Conference. Jun. 22, 2009;1447-51.
Manzanares et al., Air-coupled MUMPs capacitive micromachined ultrasonic transducers with resonant cavities. Ultrason. 2012;52:482-9.
Nikoozadeh et al., Forward-Looking Intracardiac Ultrasound Imaging Using a 1-D CMUT Array Integrated With Custom Front-End Electronics. IEEE Trans Ultrason Ferroelectr Freq Contr. Dec. 2008;55(12):2651-60.
Noble et al., A cost-effective and manufacturable route to the fabrication of high-density 2D micromachined ultrasonic transducer arrays and (CMOS) signal conditioning electronics on the same silicon substrate. Proc Ultrason Symp. 2001;941-5.
Noble et al., Low-temperature micromachined CMUTs with fully-integrated analogue front-end electronics. Proc Ultrason Symp. 2002;1045-50.
Oralkan et al., Volumetric Imaging Using 2D Capacitive Micromachined Ultrasonic Transducer Arrays (CMUTs): Initial Results. 2002 IEEE Ultrason Symp. 2002;1083-6.
Oralkan et al., Volumetric Ultrasound Imaging Using 2-D CMUT Arrays. IEEE Trans Ultrason Ferroelectr Freq Contr. Nov. 2003;50(11):1581-94.
Park et al., Fabrication of Capacitive Micromachined Ultrasonic Transducers via Local Oxidation and Direct Wafer Bonding. J Microelectromechan Syst. Feb. 2011;20(1):95-103.
Torkkeli et al., Capacitative microphone with low-stress polysilicon membrane and high-stress polysilicon backplate. Sensors and Actuators. 2000;85:116-23.
Tsuji et al., Low Temperature Process for CMUT Fabrication with Wafer Bonding Technique. IEEE Intl Ultrason Symp Proc. 2010;551-4.
Um et al., An Analog-Digital-Hybrid Single-Chip RX Beamformer with Non-Uniform Sampling for 2D-CMUT Ultrasound Imaging to Achieve Wide Dynamic Range of Delay and Small Chip Area. IEEE International Solid-State Circuits Conference. Feb. 12, 2014;426-8.
Wodnicki et al., Multi-Row Linear CMUT Array Using CMUTs and Multiplexing Electronics. Proc Ultrason Symp. 2009;2696-9.
Wolffenbuttel et al., Low-temperature silicon wafer-to-wafer bonding using gold at eutectic temperature. Sensors and Actuators A. 1994;43:223-9.
Wygant et al., Integration of 2D CMUT Arrays with Front-End Electronics for Volumetric Ultrasound Imaging. IEEE Trans Ultrason Ferroelectr Freq Contr. Feb. 2008;55(2):327-42.
Xu et al., Characterization of improved Capacitive Micromachined Ultrasonic Transducers (CMUTS) using ALD high- [Kappa] dielectric isola. MEMS. 2014 IEEE 27th International Conference on Micro Electro Mechanical Systems. Jan. 26, 2014;584-7.
Yu et al., Dual-bottom-electrode CMUT based on standard CMOS process. NEMS. 2001 IEEE International Conference. Feb. 20, 2011;21-4.
Zahorian et al., Single chip CMUT arrays with integrated CMOS electronics: fabrication process development and experimental results. Proc Ultrason Symp. 2008;386-9.
Zhuang et al., Integration of trench-isolated through-wafer interconnects with 2d capacitive micromachined ultrasonic transducer arrays. Sensors Actuators A. 2007;138:221-9.
Zhuang et al., Wafer-bonded 2-D CMUT arrays incorporating through-wafer trench-isolated interconnects with a supporting frame. IEEE Trans Ultrason Ferroelectr Freq Control. Jan. 2009;56(1):182-92. doi: 10.1109/TUFFC.2009.1018.
U.S. Appl. No. 15/626,801, filed Jun. 19, 2017, Rothberg et al.
U.S. Appl. No. 15/648,187, filed Jul. 12, 2017, Rothberg et al.
U.S. Appl. No. 15/689,863, filed Aug. 29, 2017, Rothberg et al.
U.S. Appl. No. 15/868,989, filed Jan. 11, 2018, Rothberg et al.
U.S. Appl. No. 15/910,776, filed Mar. 2, 2018, Rothberg et al.
U.S. Appl. No. 16/109,703, filed Aug. 22, 2018, Rothberg et al.

\* cited by examiner

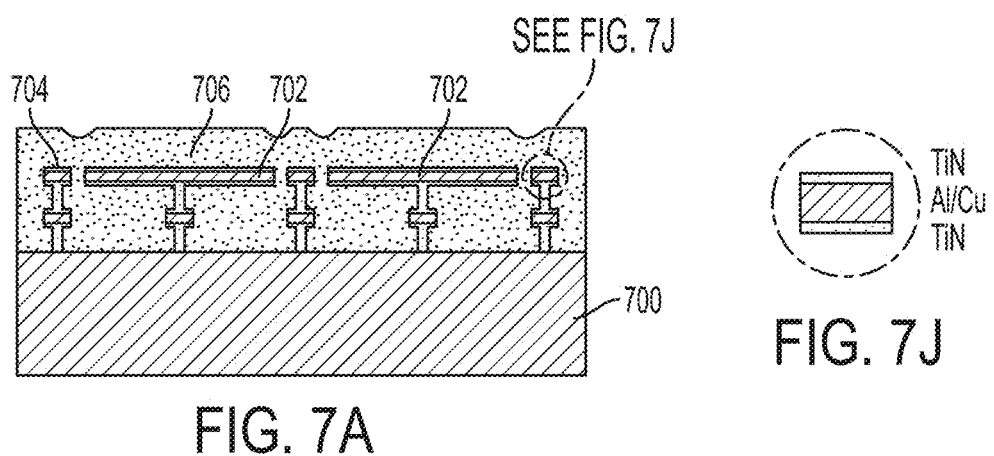
FIG. 7A
FIG. 7J
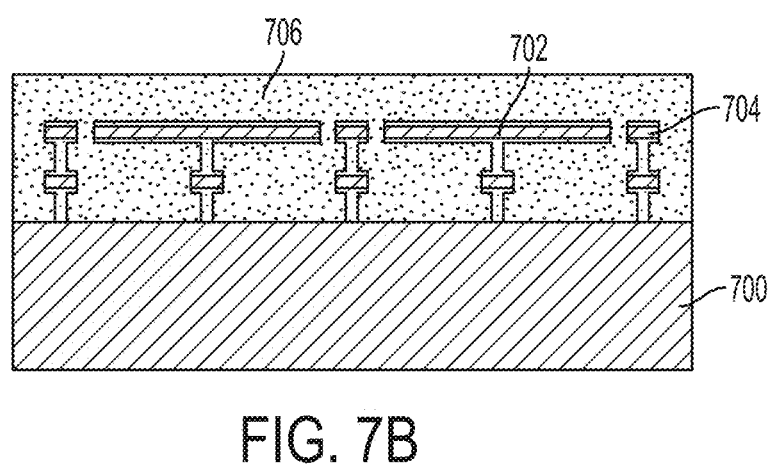
FIG. 7B

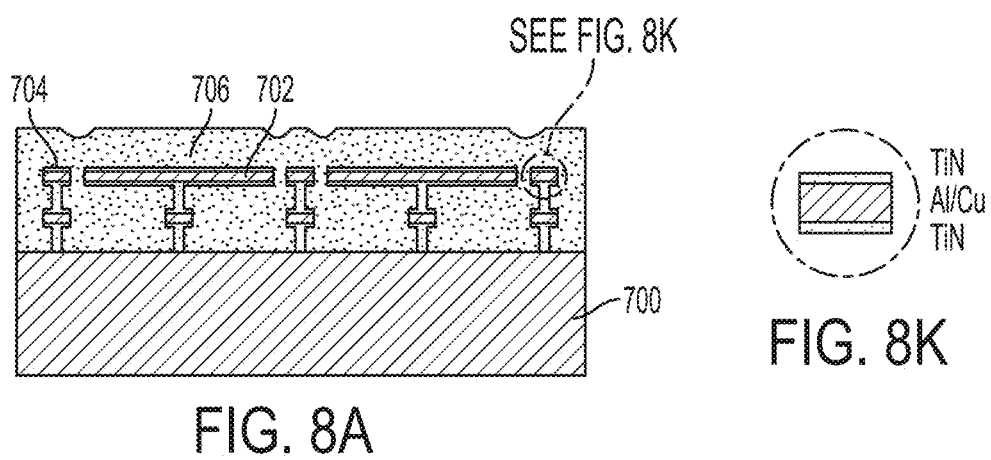
FIG. 8A
FIG. 8K
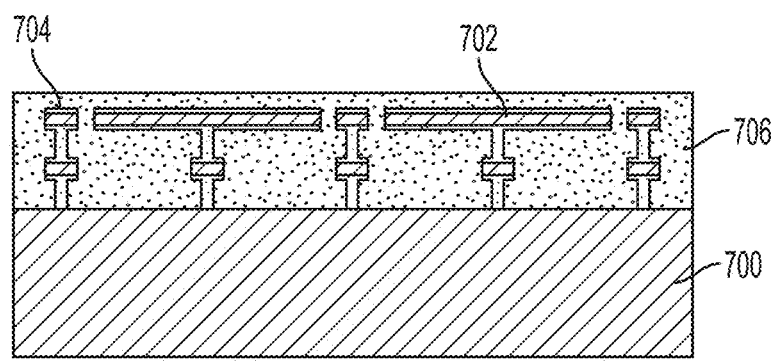
FIG. 8B

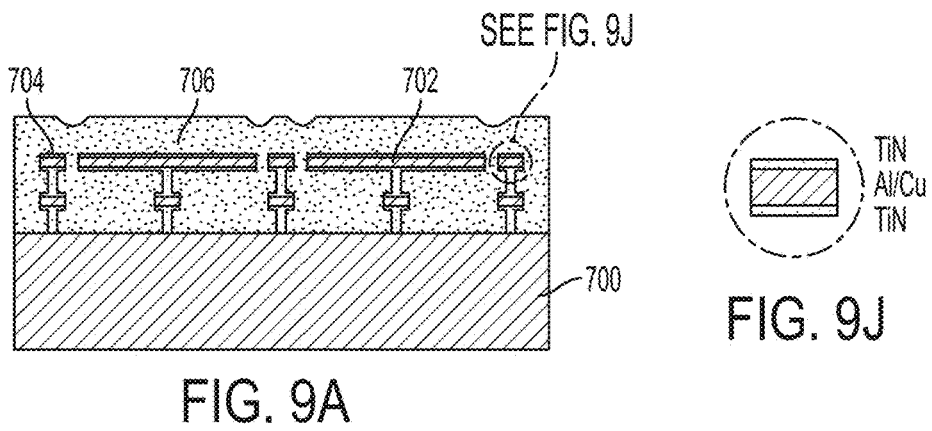
FIG. 9A
FIG. 9J
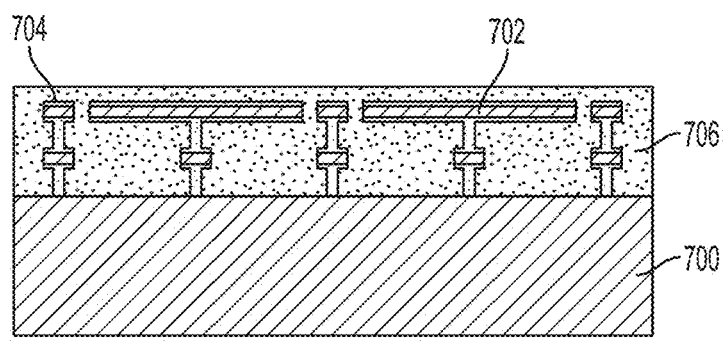
FIG. 9B
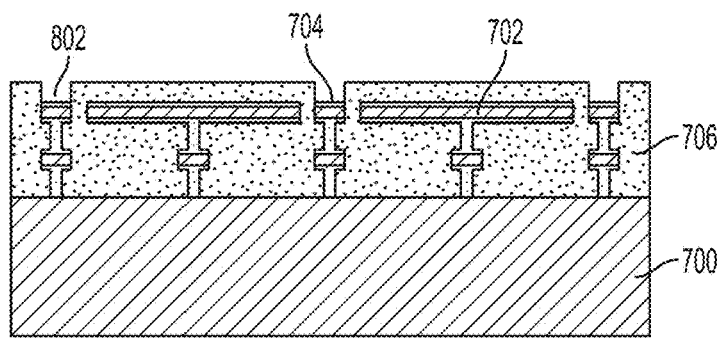
FIG. 9C

CMOS ULTRASONIC TRANSDUCERS AND RELATED APPARATUS AND METHODS

CROSS-REFERENCE TO RELATED APPLICATIONS

The present application is a continuation, claiming the benefit under 35 U.S.C. § 120 of U.S. patent application Ser. No. 15/158,968, filed May 19, 2016 and entitled "CMOS ULTRASONIC TRANSDUCERS AND RELATED APPARATUS AND METHODS," which is hereby incorporated herein by reference in its entirety. U.S. patent application Ser. No. 15/158,968 is a continuation, claiming the benefit under 35 U.S.C. § 120 of U.S. patent application Ser. No. 14/172,383, filed Feb. 4, 2014 and entitled "CMOS ULTRASONIC TRANSDUCERS AND RELATED APPARATUS AND METHODS," which is hereby incorporated herein by reference in its entirety. Application Ser. No. 14/172,383 claims the benefit under 35 U.S.C. § 119(e) of: U.S. Provisional Application Ser. No. 61/760,968, filed on Feb. 5, 2013 and entitled "CMOS ULTRASONIC TRANSDUCERS AND RELATED APPARATUS AND METHODS"; U.S. Provisional Application Ser. No. 61/760,951, filed on Feb. 5, 2013 and entitled "CMOS ULTRASONIC TRANSDUCERS AND RELATED APPARATUS AND METHODS"; U.S. Provisional Application Ser. No. 61/760,932, filed on Feb. 5, 2013 and entitled "CMOS ULTRASONIC TRANSDUCERS AND RELATED APPARATUS AND METHODS"; and U.S. Provisional Application Ser. No. 61/760,891, filed on Feb. 5, 2013 and entitled "CMOS ULTRASONIC TRANSDUCERS AND RELATED APPARATUS AND METHODS", all of which are hereby incorporated herein by reference in their entireties.

BACKGROUND

Field

Aspects of the present application relate to complementary metal oxide semiconductor (CMOS) Ultrasonic Transducers (CUTs) and related apparatus and methods.

BRIEF SUMMARY

According to an aspect of the present application, a method comprises forming a cavity in a first wafer above a complementary metal oxide semiconductor (CMOS) circuit in the first wafer, bonding, using direct bonding, the first wafer and a second wafer together such that the second wafer seals the cavity of the first wafer, thereby forming a sealed cavity. The second wafer may be a silicon-on-insulator wafer or a bulk silicon wafer having a degeneratively doped layer. The method further comprises and forming an ultrasonic transducer membrane from the second wafer subsequent to bonding the first and second wafers together.

According to an aspect of the present application, a method comprises depositing a first conductive layer on a silicon wafer, depositing a second conductive layer on the first conductive layer, depositing a first layer of $SiO_2$ on the second conductive layer, etching at least one cavity in the first layer of $SiO_2$, a bottom surface of the at least one cavity corresponding to the second conductive layer, and depositing a second layer of $SiO_2$ on the first layer of $SiO_2$. The method further comprises planarizing the second layer of $SiO_2$, bonding a second wafer comprising silicon to the silicon wafer with a fusion bond, thinning a backside of the second wafer distal the at least one cavity to form a membrane over the at least one cavity, and depositing a third conductive layer on the membrane.

According to an aspect of the present application, an apparatus comprises a first wafer having a cavity formed therein and a complementary metal oxide semiconductor (CMOS) circuit, a membrane overlying the cavity, and an electrical contact on the first wafer and contacting a bottom side of the membrane and connecting the membrane to the CMOS circuit, the bottom side of the membrane being proximate the cavity.

BRIEF DESCRIPTION OF DRAWINGS

Various aspects and embodiments of the application will be described with reference to the following figures. It should be appreciated that the figures are not necessarily drawn to scale. Items appearing in multiple figures are indicated by the same reference number in all the figures in which they appear.

FIGS. 7A-7J illustrate, in cross-sectional views, a process of fabricating a membrane covering one or more cavities and making electrical contact to a top side of the membrane, according to a non-limiting embodiment of the present application.

FIGS. 8A-8K illustrate, in cross-sectional views, a process of fabricating a membrane covering one or more cavities and making electrical contact to a bottom side of the membrane, according to a non-limiting embodiment of the present application.

FIGS. 9A-9J illustrate an alternative process to that of FIGS. 8A-8K for fabricating a membrane covering one or more cavities and making electrical contact to a bottom side of the membrane, according to an alternative non-limiting embodiment of the present application.

DETAILED DESCRIPTION

Figure 1:
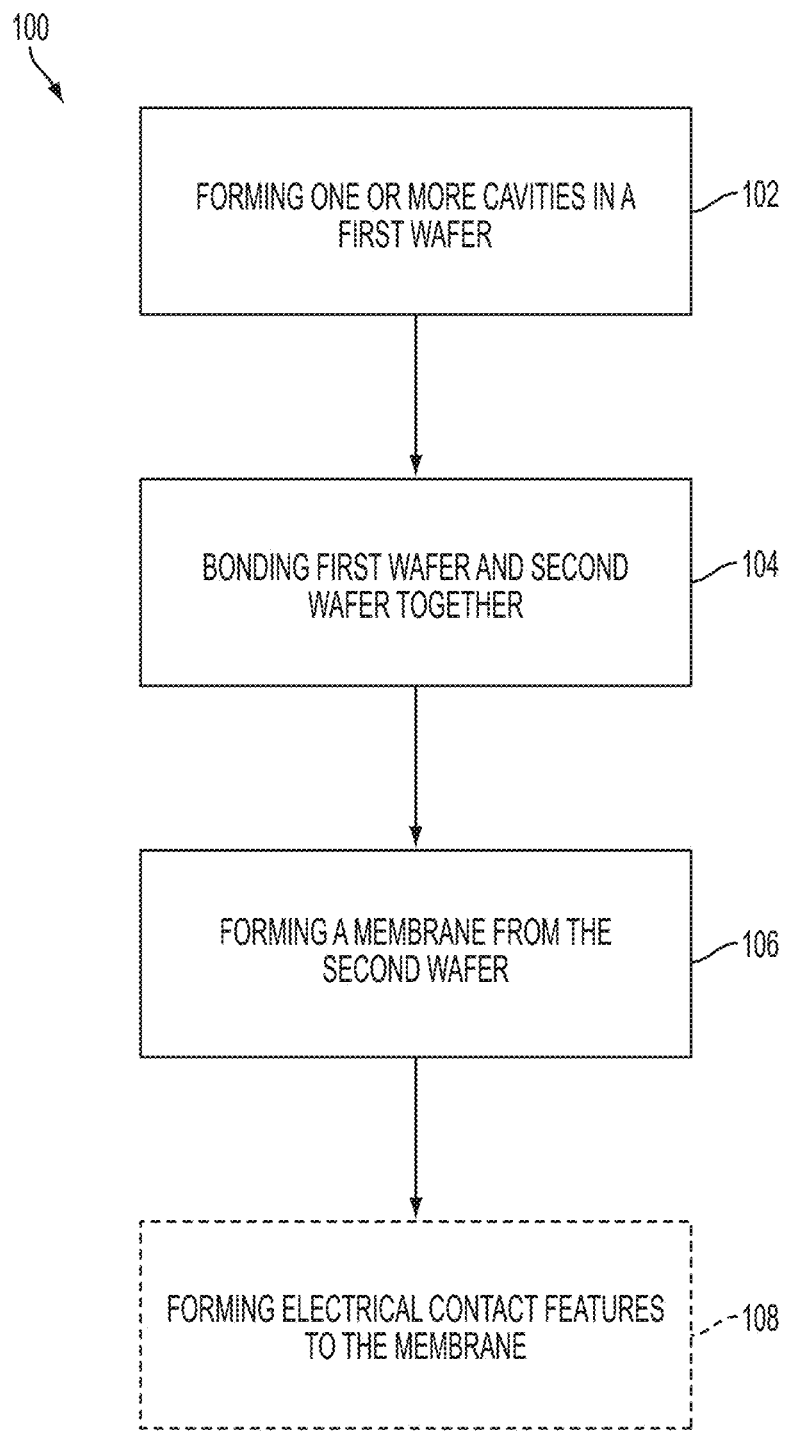
FIG. 1 illustrates a method of forming a sealed cavity in a first wafer with a membrane from a second wafer, according to a non-limiting embodiment of the present application.

Capacitive micromachined ultrasonic transducers (CMUTs) are known. Processes for making CMUTs are inadequate for integrating CMUTs with complementary metal oxide semiconductor (CMOS) wafers. Thus, suitable integration of circuitry (e.g., control circuitry) for micromachined ultrasonic transducers has not been achieved.

Aspects of the present application relate to CMOS Ultrasonic Transducers (CUTs). According to some aspects, methods for fabricating CUTs are provided. The methods may facilitate formation of ultrasonic transducers which may be integrated with circuitry (e.g., silicon CMOS circuitry) to form highly integrated devices, in contrast to conventional ultrasonic transducers which were bonded to or wired to controlling circuitry. According to an aspect of the present application, the methods may be scalable, allowing for fabrication of large quantities of CUTs in an efficient and cost effective manner.

Aspects of the present application provide a CMOS ultrasonic transducer having a membrane overlying a cavity, and for which metallization on the membrane is not included. Electrical contact to the membrane may be provided by suitable interconnects from below the membrane. According to a non-limiting embodiment, the cavity may be formed in a first wafer (e.g., a CMOS wafer including integrated circuitry). The membrane may be formed to overlie the cavity by bonding a second wafer to the first wafer and then forming the membrane from the second wafer. Electrical contacts (e.g., Tungsten plugs) may be formed on the first wafer (e.g., through one or more via holes in the first wafer) and may provide electrical contact to the membrane. In this manner, metallization on the membrane may be avoided, which may provide improvements in performance of the ultrasonic transducer.

According to an aspect of the present application, a fabrication method involves forming one or more cavities in a wafer, bonding the wafer to another wafer, and forming a membrane over the one or more cavities using the second wafer. As used in this application, a membrane may be one or more layers of materials sufficiently thin in consideration of the cross-sectional dimensions to allow for flexing or bending of the layer(s) over the unsupported portion, for example in response to application of an acoustically or electrically induced force. The first wafer in which the cavities are formed may be a CMOS wafer, and in some embodiments may include integrated circuitry. The processing may be low temperature processing (e.g., involving only steps performed at less than 450° C.), which may preserve the integrity of metal layers formed on the device (e.g., metallization of the first wafer). For example, aluminum metal layers used for wiring and/or electrodes, or other metal layers, may be left intact by subsequent processing steps of the method. Thus, fully integrated devices including metallization and integrated circuitry may be achieved. Moreover, because wafer-level processing is performed, large quantities of devices may be formed, which may facilitate cost-effective fabrication.

The aspects and embodiments described above, as well as additional aspects and embodiments, are described further below. These aspects and/or embodiments may be used individually, all together, or in any combination of two or more, as the application is not limited in this respect.

FIG. 1 illustrates a method of forming a sealed cavity with a membrane, according to a non-limiting embodiment of the present application. As shown, the method 100 comprises forming one or more cavities in a first wafer at stage 102. The first wafer may be any suitable type of wafer, non-limiting examples of which are described below. The first wafer may be a CMOS wafer, and in some embodiments may include integrated circuitry. As used in this application, the term "wafer" may include a base layer (e.g., a silicon substrate or wafer) or a base layer in combination with any layers formed on the base layer. For example, in some embodiments, the first wafer may be a silicon wafer with one or more conductive or metal layers and one or more insulating layers. The one or more cavities may be formed in an insulating layer in a non-limiting embodiment, though other configurations are also possible.

At stage 104, the first wafer may be bonded to a second wafer, resulting in the one or more cavities of the first wafer being sealed by the second wafer. The second wafer may be any suitable type of wafer, such as a bulk silicon wafer, a silicon-on-insulator (SOI) wafer, or an engineered substrate including a polysilicon or amorphous silicon layer, an insulating layer, and a silicon layer, with the insulating layer between the polysilicon and silicon layers.

The bonding at stage 104 may be direct bonding (i.e., fusion bonding). Thus, stage 104 may involve energizing respective surfaces of the first and second wafers and then pressing the wafers together with suitable pressure to create the bond. A low temperature anneal may be performed. While fusion bonding represents one example of a suitable bonding technique, other bonding techniques may alternatively be used, including for example bonding two wafers through the use of one or more intermediate layers (e.g., adhesive(s)).

At stage 106, a membrane may be formed from the second wafer. As a result, the one or more cavities of the first wafer may be sealed by a membrane. Membranes may be relatively thin compared to the second wafer, for example the membrane having a thickness (e.g., as measured in a direction generally parallel to a depth of a corresponding cavity) less than 100 microns, less than 50 microns, less than 40 microns, less than 30 microns, less than 20 microns, less than 10 microns, less than 5 microns, less than 1 micron, less than 0.1 microns, any range of thicknesses in between, or any other suitable thickness. The thickness may be selected in some embodiments based on a desired acoustic behavior of the membrane, such as a desired resonance frequency of the membrane.

Formation of the membrane at stage 106 may be performed in any suitable manner, which may depend at least partially on the type of wafer used as the second wafer. Non-limiting examples of suitable wafer types are described below, and include bulk silicon wafers, SOI wafers, and engineered substrates of the types previously described. In some embodiments, stage 106 may comprise thinning a backside of the second wafer.

Thus, stages 102, 104, and 106 of method 100 may result in one or more sealed cavities in which the one or more cavities are sealed by a membrane. Optional further processing may be performed, such as formation of metal layers, contact pads, or other features for providing electrical contact to the membrane. Such processing is illustrated as optional by the dashed box of stage 108, which in the non-limiting example illustrated is referred to as a stage of forming one or more electrical contact features to the membrane.

The method 100 may be performed according to various alternative process flows. The process flows may, in some embodiments, involve only low temperature processing, for example including no processing above 450° C. Low temperature processing may be beneficial to preserve metal layers of the device, and thus formation of a fully integrated device.

A non-limiting example of a manner of forming one or more sealed cavities in accordance with the method 100 of FIG. 1 is now described.

The method may begin with formation of one or more cavities in a first wafer. The first wafer may be a silicon wafer with one or more additional layers formed thereon. For example, one or more metal layers and/or one or more insulating layers may be formed on the silicon wafer. According to an aspect of the present application, the method of FIG. 1 may be used as part of a process of forming a CUT, and thus it may be desirable in some embodiments to have an electrode located below any cavities in the first wafer to provide electrical contact to the cavity and control of the behavior of the cavity (e.g., the capacitive behavior of the cavity), or to receive/track behavior of the cavity.

Figure 2A:
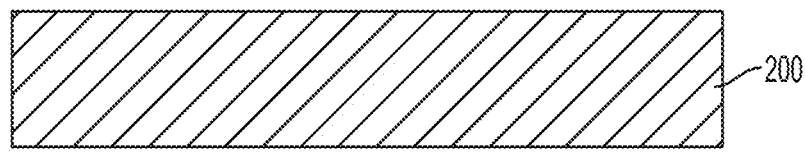
FIGS. 2A-2G illustrate, in cross-sectional views, a process of forming one or more cavities in a wafer, according to a non-limiting embodiment of the present application.

Referring to the FIG. 2A, formation of one or more cavities in the first wafer may begin with a silicon wafer 200 of any suitable thickness. The silicon wafer may be a bulk silicon wafer, the use of which may facilitate low cost production. For example, the silicon wafer may be a bulk 8 inch silicon wafer, though other sizes may alternatively be used. In some embodiments, the first wafer may be a CMOS wafer, and may include multiple layers including layers for circuitry.

Figure 2B:
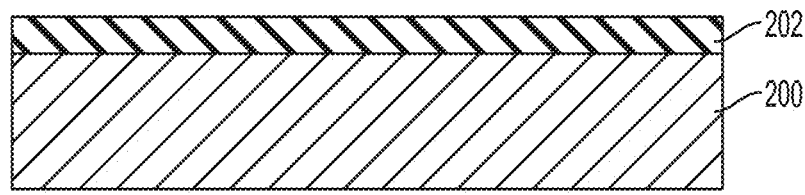

As shown in FIG. 2B, a first layer 202 may be deposited on the silicon wafer 200. The first layer 202 may be conductive and may be formed of any suitable conductive material (e.g., metal) and may have any suitable thickness. According to a non-limiting embodiment, the first layer 202 may function as an electrode layer in the resulting device. Thus, the first layer 202 may be formed of aluminum, for example, and may have a thickness between approximately 0.2 microns and approximately 2 microns, between approximately 0.2 microns and approximately 1 micron, a thickness of approximately 0.4 microns, 0.5 microns, 0.6 microns, any thickness or range of thicknesses in between, or any other suitable thickness. Moreover, if the first layer 202 is to function as an electrode, it may be configured as a blanket electrode (e.g., to control operation of one or more of the cavities described below) or may be patterned to provide individual control to one or more of the cavities formed in the first wafer.

Figure 2C:
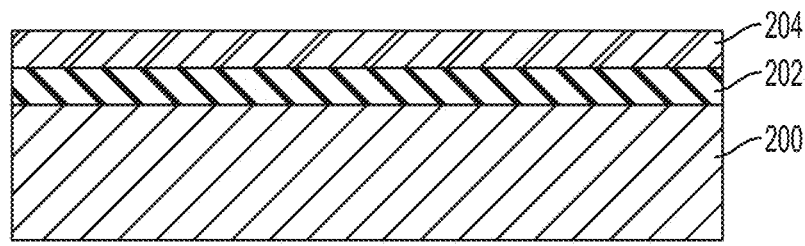

As shown in FIG. 2C, a second layer 204 may be deposited on the first layer 202. The second layer 204 may be conductive in some embodiments and may function in some embodiments as a seal layer (or interface layer or barrier layer or liner) for the first layer, and may be formed of any suitable material (e.g., a metal) and have any suitable thickness. In some embodiments, the second layer 204 may additionally or alternatively function as an etch stop for later selective etching, as will be described further below. As a non-limiting example, the second layer 204 may be formed of titanium nitride (TiN) and may have a thickness between approximately 200 Angstroms and approximately 2,000 Angstroms, between approximately 400 Angstroms and approximately 1,000 Angstroms, a thickness of approximately 500 Angstroms, approximately 600 Angstroms, approximately 700 Angstroms, any thickness or range of thicknesses in between, or any other suitable thickness.

Figure 2D:
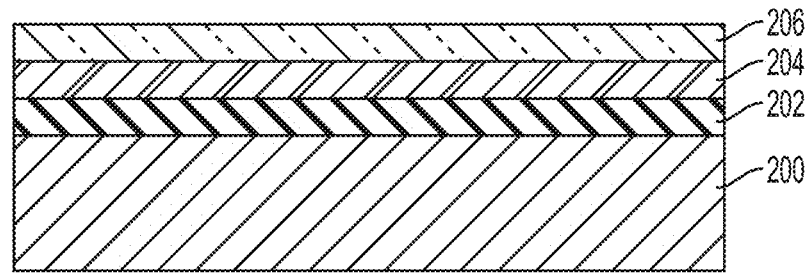

As shown in FIG. 2D, an insulating layer 206 may then be formed on the second layer 204. The insulating layer may serve as the material in which the one or more cavities may be formed, and thus may have any suitable thickness for performing such functionality. According to a non-limiting embodiment, the insulating layer 206 may be SiO$_2$ (e.g., formed via tetraethyl orthosilicate (TEOS)), or any other suitable insulating material. In some embodiments, the insulating layer 206 may be an oxide formed by high density plasma (HDP) deposition. Deposition of insulating layer 206 may be a low temperature deposition process, for example involving temperatures no higher than 450° C. As an example, deposition of SiO$_2$ via TEOS may be performed below 450° C. (e.g., around 400° C.). The insulating layer 206 may have any suitable thickness, such as a thickness between approximately 0.1 microns and approximately 10 microns, between approximately 0.5 microns and approximately 5 microns, a thickness of approximately 1 micron, approximately 2 microns, approximately 3 microns, any thickness or range of thicknesses in between, or any other suitable thickness. The thickness of the insulating layer 206 may correspond to (e.g., be equal to or approximately equal to, be proportional to, or be at least partially determinative of) the depth of the subsequently formed cavities, and thus the thickness may be chosen to provide a desired cavity depth.

At this stage, an optional planarization process may be performed. For example, chemical mechanical polishing (CMP) may be performed to planarize the surface of the insulating layer 206.

It should be appreciated that the first layer 202, the second layer 204, and insulating layer 206 may be provided with a CMOS wafer in some embodiments (e.g., as a starting wafer from a supplier), and that additional layers (e.g., below the first layer 202) may also be provided in some embodiments. For purposes of simplicity, however, such additional layers are not illustrated.

Figure 2E:
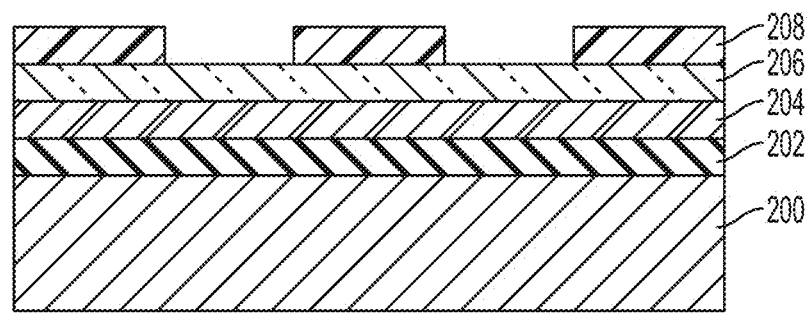
Figure 2F:
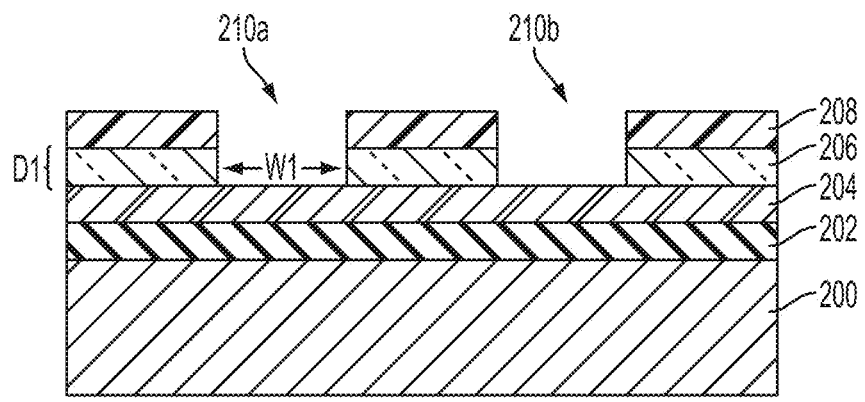

Next, the insulating layer 206 (e.g., SiO$_2$ formed by TEOS) may be etched to form one or more cavities therein. For example, as shown in FIG. 2E, photoresist 208 may be deposited and patterned using standard photolithography techniques. Then, as shown in FIG. 2F, a selective etch may be performed of the insulating layer 206 using the photoresist 208 as an etch mask. The selective etch may have high selectivity for the insulating layer 206 and low selectivity for the second layer 204, such that the second layer 204 (e.g., TiN) may serve as an etch stop. In some embodiments silicon oxynitride (SiON) may be used on top of or in place of TiN, as an example, and may function as an etch stop. The etch may be a reactive ion etch (RIE), deep reactive ion etch (DRIE), or any other suitable selective etch. As shown, cavities 210a and 210b may result from the etching process.

The cavities 210a and 210b may have any suitable shapes. For example, when considering a top view (as opposed to the cross-sectional view of FIG. 2F), the cavities may be rectangular, square, pentagonal, hexagonal, octagonal, have three or more sides, may be oval, circular, or have any other shape. As will be described further below, a membrane will be formed over the cavities, and thus the cavities may have a shape corresponding to a desired membrane shape, which may be selected based on desired acoustic properties of the membrane, for example. Also, not all cavities formed on the first wafer need have the same shape.

The cavities 210a and 210b may have any suitable dimensions, including any suitable width W1 and any suitable depth D1. The width W1 may be, for example, between approximately 5 microns and approximately 500 microns, between approximately 20 microns and approximately 100 microns, may be approximately 30 microns, approximately 40 microns, approximately 50 microns, any width or range of widths in between, or any other suitable width. In some embodiments, cavities 210a and 210b may have different widths. In some embodiments, the width W1 may be selected to maximize the void fraction, i.e., the amount of area consumed by the cavities compared to the amount of area consumed by surrounding structures (e.g., insulating layer 206). The depth D1 may be, for example, between approximately 0.05 microns and approximately 10 microns, between approximately 0.1 microns and approximately 5 microns, between approximately 0.5 microns and approximately 1.5 microns, any depth or range of depths in between, or any other suitable depth. In some embodiments, the cavities 210a and 210b may have different depths. In some embodiments, the cavity dimensions and/or the membrane thickness of any membrane overlying the cavity may impact the frequency behavior of the membrane, and thus may be selected to provide a desired frequency behavior (e.g., a desired resonance frequency of the membrane). For example, it may be desired in some embodiments to have an ultrasonic transducer with a center resonance frequency of between approximately 20 kHz and approximately 200 MHz, between approximately 1 MHz and approximately 10 MHz, between approximately 2 MHz and approximately 5 MHz, between approximately 50 kHz and approximately 200 kHz, of approximately 2.5 MHz, approximately 4 MHz, any frequency or range of frequencies in between, or any other suitable frequency. For example, it may be desired to use the devices in air, gas, water, or other environments, for example for medical imaging, materials analysis, or for other reasons for which various frequencies of operation may be desired. The dimensions of the cavity and/or membrane may be selected accordingly.

In some embodiments, the width W1 and depth D1 may represent the final width and depth of the cavities of a CUT, and thus may be selected to fall within desired ranges. However, as will be described further below, in some embodiments one or more additional layers may be deposited within the cavities 210a and/or 210b, such that the final width and depth of the cavit(ies) may depend on the thickness of any such additional layers. Also, not all cavities formed on the first wafer need have the same dimensions. It is noted that the dimension W1 is described as being a width, but more generally may refer to the dimension in the plane of the insulating layer 206.

The number of cavities 210a and 210b is non-limiting. For purposes of illustration, only two cavities are illustrated. However, any one or more cavities may be formed on the first wafer, including hundreds of cavities, thousands of cavities, or millions of cavities, as non-limiting examples. In some embodiments, patterns or arrays of cavities may be formed.

After the stage of FIG. 2F, the photoresist 208 may then be removed (or stripped) in any suitable manner and the wafer may be cleaned.

Figure 2G:
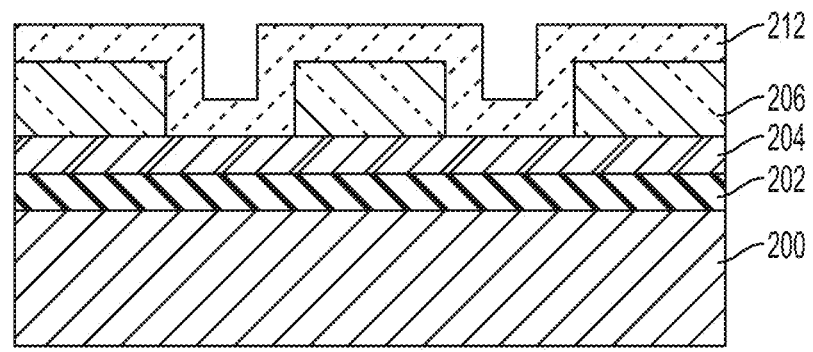

Optionally, a further insulating layer, such as a layer of $SiO_2$, may be deposited on the first wafer as shown in FIG. 2G. In particular, insulating layer 212 may be deposited with a conformal deposition such that it covers the bottom and sidewalls of the cavities 210a and 210b. In some embodiments, the insulating layer 212 may be deposited in anticipation of bonding the first wafer with a second wafer, and thus may be formed of a material suitable for such bonding (e.g., being formed of a material suitable for fusion bonding with the second wafer). The insulating layer may be $SiO_2$ in some embodiments formed by TEOS. Other materials are also possible. The insulating layer may have any suitable thickness, such as a thickness between approximately 100 Angstroms and approximately 2,000 Angstroms, between approximately 200 Angstroms and approximately 1,000 Angstroms, between approximately 300 Angstroms and approximately 800 Angstroms, a thickness of approximately 400 Angstroms, approximately 500 Angstroms, approximately 600 Angstroms, any thickness or range of thicknesses in between, or any other suitable thickness.

Additional cleaning and/or planarization steps may then be performed. For example, CMP may be performed after the stage illustrated in FIG. 2G to planarize the first wafer in preparation for bonding with a second wafer.

It should be appreciated that at the step shown in FIG. 2G the first wafer includes a plurality of cavities (e.g., cavities 210a and 210b) and may be prepared for bonding with a second wafer via direct bonding or any other suitable bonding technique. Thus, the structure illustrated in FIG. 2G may represent the finished product of stage 102 of method 100.

Figure 3A:
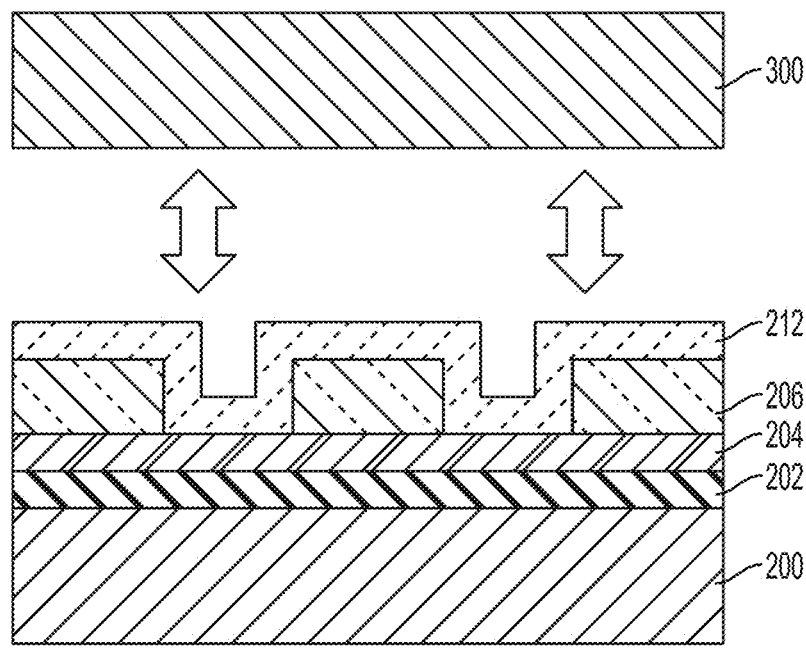
FIGS. 3A-3B illustrate, in cross-sectional views, a process of bonding a first wafer comprising one or more cavities with a second wafer, according to a non-limiting embodiment of the present application.
Figure 3B:
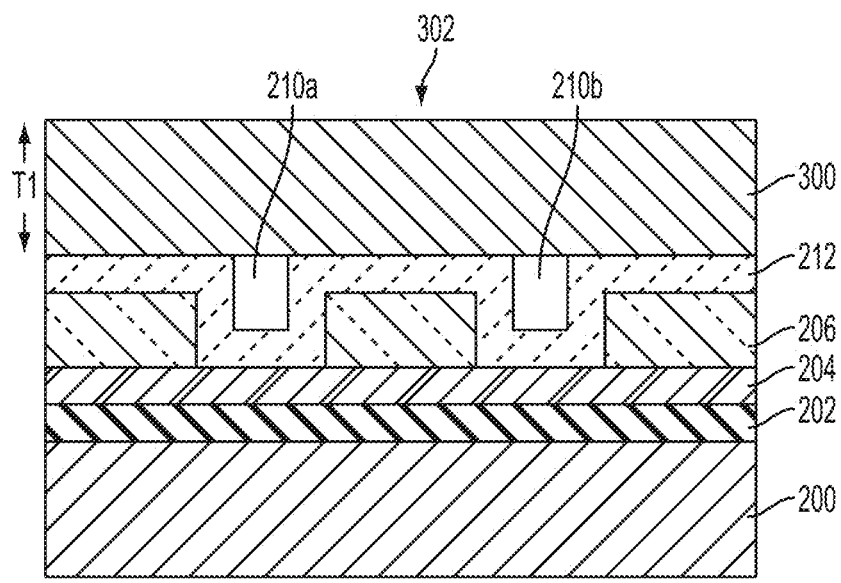

As previously described, the method 100 may further comprise stage 104 at which the first wafer and a second wafer are bonded together. FIGS. 3A and 3B illustrate a non-limiting example of bonding the first wafer of FIG. 2G to a second wafer 300 having a backside 302 and a thickness T1. The thickness T1 may be greater than desired in some circumstances, and thus may be later reduced (e.g., by thinning), as will be described further below.

As shown in FIG. 3A, the first wafer and second wafer 300 may be aligned and bonded together as reflected by the arrows, resulting in the bonded structure illustrated in FIG. 3B. As shown in FIG. 3B, the cavities 210a and 210b are now sealed by the second wafer 300. The structure of FIG. 3B may correspond to the resulting structure from stage 104 of method 100 of FIG. 1.

Figure 4A:
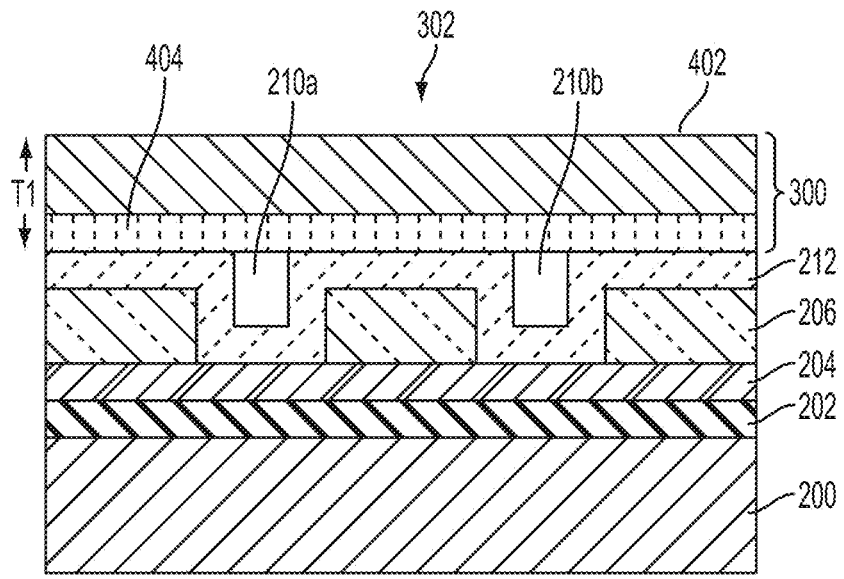
FIGS. 4A-4C illustrate, in part, three non-limiting alternative implementations of the second wafer of the structure from FIG. 3B.

The second wafer 300 may be one of various types of suitable wafers. According to one embodiment, the wafer 300 may be a bulk wafer, such as a bulk silicon wafer. The bulk wafer may include a layer that is degeneratively doped (e.g., with P+). FIG. 4A illustrates a non-limiting example, showing the structure of FIG. 3B but with a wafer 300 that is a bulk wafer 402 having a degeneratively doped layer 404.

The degeneratively doped layer 404 may serve one or more functions, and may have any suitable thickness. As will be described further below, in some embodiments a membrane may be formed from the wafer 300, and it may be desirable for the membrane to be conductive. Thus, the degeneratively doped layer 404 may provide such conductive functionality. Also, the degeneratively doped layer 404 may serve as an etch stop in some embodiments for thinning of the wafer 300 from the backside 302. Thus, the thickness of the degeneratively doped layer 404 may correspond to (e.g., be equal to or approximately equal to, be proportional to, or be at least partially determinative of) the thickness of a resulting membrane formed from the wafer 300, and thus the thickness of the degeneratively doped layer 404 may be selected based on a desired membrane thickness.

Figure 4B:
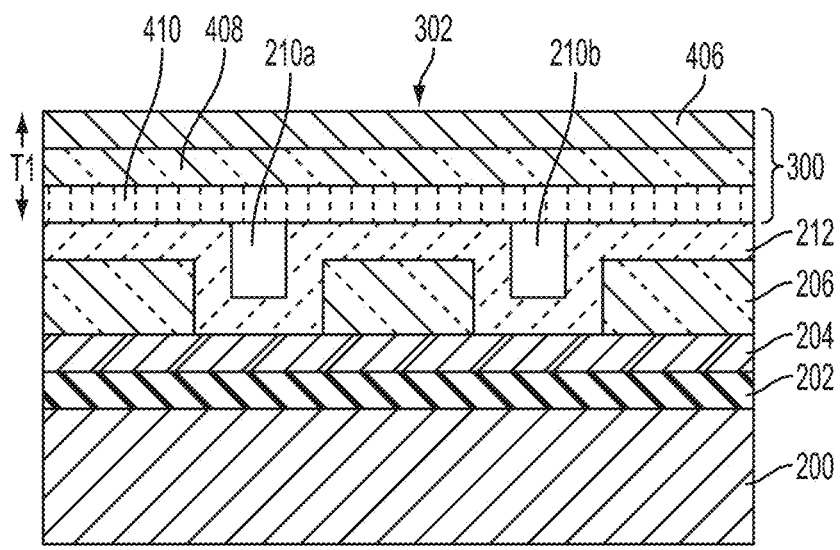

A second suitable type of wafer 300 according to some embodiments is a silicon-on-insulator (SOI) wafer. A non-limiting example is shown in FIG. 4B. The SOI wafer includes a base silicon layer 406, an insulating layer 408 (e.g., a buried oxide (BOX) layer) and a second silicon layer 410 (proximate the first wafer).

The insulating layer 408 may be a $SiO_2$ layer or any other suitable insulating material. The insulating layer (e.g., BOX layer) 408 may serve as an etch stop in some embodiments, for example if it is desired to thin the wafer 300 from the backside 302. The insulating layer may have any suitable thickness.

The second silicon layer 410 may be degeneratively doped, for example to serve as a membrane. In some embodiments, the second silicon layer 410 may correspond substantially to a resulting membrane formed during later fabrication stages, and thus may have a thickness selected to correspond substantially to a desired thickness of a resulting membrane (e.g., between approximately 0.05 micron and approximately 10 microns, between approximately 0.2 microns and approximately 5 microns, between approximately 0.5 microns and approximately 3 microns, any thickness or range of thicknesses in between, or any other suitable thickness).

Figure 4C:
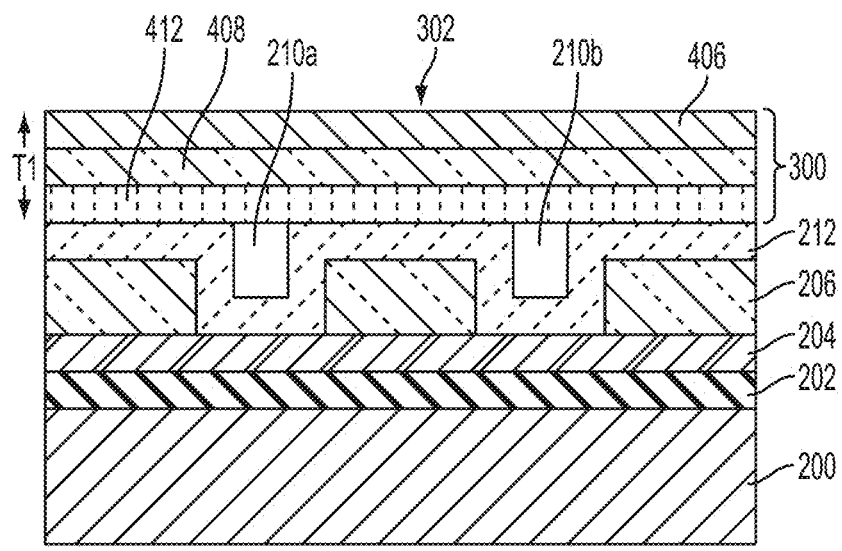

A third type of suitable wafer 300 according to some embodiments represents a variation on the SOI wafer of FIG. 4B. As shown in FIG. 4C, the wafer 300 may include the base silicon layer 406, the insulating layer 408, and a polysilicon or amorphous silicon layer 412. As with the second silicon layer 410 of the SOI wafer, the polysilicon or amorphous silicon layer 412 may ultimately serve as a membrane. A membrane need not necessarily be formed of single crystal material, and thus polysilicon (and, in some embodiments, amorphous material such as amorphous silicon) may alternatively be used. The polysilicon or amorphous silicon layer 412 may be degeneratively doped as previously described in connection with degeneratively doped layer 404 and second silicon layer 410. The polysilicon or amorphous silicon layer 412 may have a thickness selected to correspond substantially to a desired thickness of a membrane, in some embodiments (e.g., between approximately 1 micron and approximately 10 microns, between approximately 2 microns and approximately 5 microns, any thickness or range of thicknesses in between, or any other suitable thickness). In some embodiments, the wafer 300 of FIG. 4C may be considered an engineered substrate.

As described in connection with FIGS. 3A-3B, the first wafer and second wafer 300 may be bonded together. The type of bonding performed in FIGS. 3A-3B may be any suitable type of bonding for bonding two wafers together, and in some embodiments may preferably be fusion bonding (also referred to herein as "direct bonding"), thus avoiding the need for any bonding adhesives. In some embodiments, a low temperature (e.g., below 450° C.) anneal may be performed as part of the bonding process.

In those embodiments in which fusion bonding is used, the interfacing (or contacting) materials of the first and second wafers may be chosen to ensure bonding compatibility. For instance, the wafer 300 may include a layer of silicon (single crystal, polycrystalline, or amorphous) configured to contact the insulating layer 212 of the first wafer, and the insulating layer 212 may be $SiO_2$, which may be suitably direct-bonded to the silicon of the second wafer 300. Other bonding pairs are also possible.

In some embodiments, the second wafer 300 may be a full thickness wafer, such that bonding the first wafer to the second wafer may involve bonding a full thickness wafer. However, in other embodiments the second wafer may be thinned (e.g., by grinding) to a target thickness prior to bonding.

As described previously in connection with the method of FIG. 1, aspects of the present application may involve forming a membrane from one of two wafers bonded together, such as in stage 106 of method 100. Non-limiting examples are considered in the context of FIGS. 3A-3B, and 4A-4C.

As described previously in connection with FIG. 3B, the second wafer 300 may have a thickness T1. In some embodiments, it may be desirable to form a membrane covering the cavities 210a and/or 210b, and the thickness T1 may be greater than that desired for forming such a membrane. Thus, in some embodiments, the wafer 300 may have its thickness T1 reduced, for example by thinning from the backside 302 of the wafer 300. The amount of thinning may depend on the desired resulting membrane thickness.

The process for thinning the wafer 300 may depend on the type of wafer 300. Thus, non-limiting examples of thinning processes are now described in the context of the structures of FIGS. 4A-4C.

Referring to FIG. 4A, the second wafer 300 includes the bulk wafer 402 and the degeneratively doped layer 404. The second wafer 300 may be thinned from the backside 302. Such thinning may be performed in stages, depending on the thickness T1. For example, mechanical grinding providing coarse thickness control (e.g., 10 micron control) may initially be implemented to remove a relatively large amount of the bulk wafer 402. In some embodiments, the thickness control of the mechanical grinding may vary from coarse to fine as the thinning process progresses. Then, CMP may be performed on the backside 302 of the second wafer 300 to a distance close to the degeneratively doped layer 404. Next, a selective etch, such as a selective chemical etch, may be performed. The selective etch may stop on the degeneratively doped layer 404, thus leaving the structure illustrated in FIG. 5A. As shown, the resulting second wafer 300 includes only the degeneratively doped layer 404 having a thickness T2. The thickness T2 may be less than (and in some embodiments, significantly less than) the thickness T1. The thickness T2 may be any of the thicknesses described herein as being suitable for a membrane, or any other suitable membrane thickness. As a result, the degeneratively doped layer 404 may be considered a membrane covering the cavities 210a and 210b.

Figure 5A:
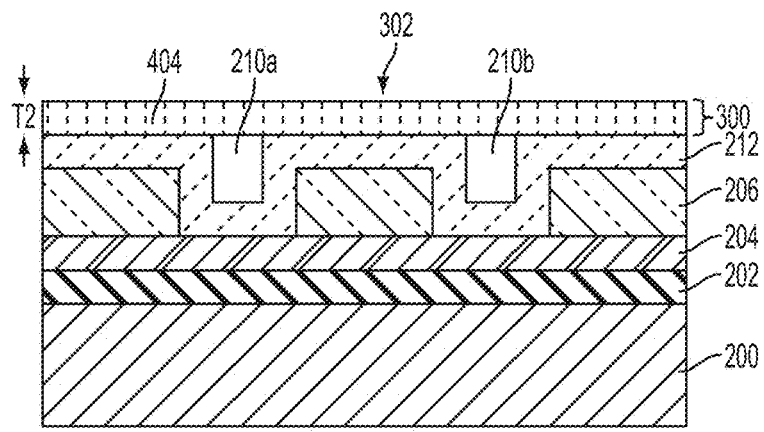
FIGS. 5A-5C illustrate three non-limiting examples of structures including a membrane formed from a second wafer and covering one of more cavities in a first wafer.

The structure of FIG. 5A may optionally be polished after thinning is performed.

The thinning process may proceed differently for the structures of FIGS. 4B and 4C than for the structure of FIG. 4A. Initially, the base silicon layer 406 may be thinned from the backside 302 of the wafer 300 using mechanical grinding. For example, mechanical grinding providing coarse thickness control (e.g., 10 micron control) may initially be implemented to remove a relatively large amount of the base silicon layer 406. In some embodiments, the thickness control of the mechanical grinding may vary from coarse to fine as the thinning process progresses. Next, a selective etch, such as a selective chemical etch, may be performed to remove the remaining base silicon layer 406. The selective etch may stop on the insulating layer (e.g., a BOX layer) 408.

The insulating layer 408 may then be removed in any suitable manner, for example using any suitable etch technique for removing such insulating layers.

Figure 5B:
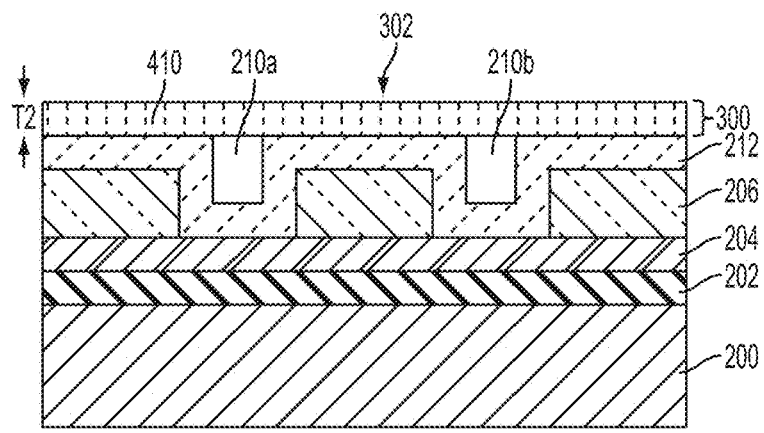

Thinning the wafer 300 in FIG. 4B in the manner described may produce the structure of FIG. 5B. As shown, the wafer 300 includes only the second silicon layer 410 having the thickness T2. The second silicon layer 410 may be considered a membrane covering the cavities 210a and 210b.

Figure 5C:
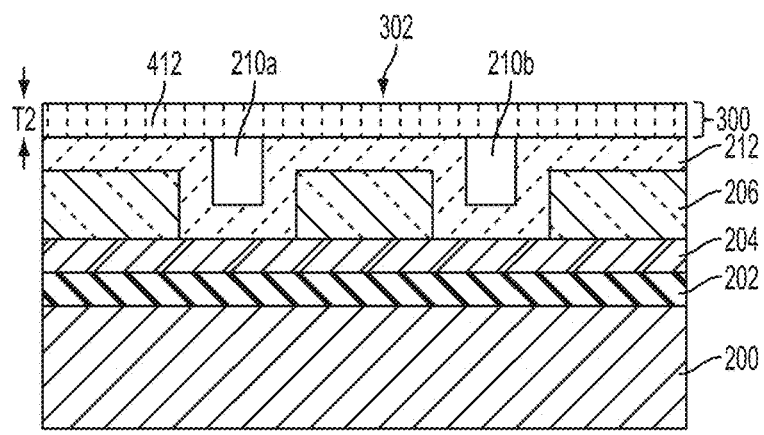

Thinning the wafer 300 in FIG. 4C in the manner described may produce the structure of FIG. 5C. As shown, the wafer 300 includes only the polysilicon or amorphous silicon layer 412 having the thickness T2. The polysilicon or amorphous silicon layer 412 may be considered a membrane covering the cavities 210a and 210b.

Another manner to form the membranes illustrated in FIGS. 5A-5C is by performing a suitable anneal and splitting process. For example, the second wafer may be a bulk wafer having a layer doped with $H_2+/He_2+$. The second wafer may be bonded to the first wafer such that the doped layer contacts the first wafer. An anneal (e.g., a low temperature anneal) may then be performed and the second wafer may be split, leaving only the doped layer portion of the second wafer, which may be considered a membrane. Optionally, the backside of the doped layer may then be polished and/or further etched.

Optionally, one or more passivation layers may be deposited over the structures of FIGS. 5A-5C. For example, relatively thin (e.g., any thickness less than or equal to 1,000 Angstroms) passivation layers of $SiO_2$ and SiN may be deposited on the degenerative layer 404, the second silicon layer 410 or the polysilicon or amorphous silicon layer 412.

Even if not deposited over the membranes, passivation may be provided at the edge(s) of the wafers in some embodiments.

The structures of FIGS. 5A-5C are non-limiting examples of structures resulting from stages 102, 104, and 106 of method 100 of FIG. 1. As previously described in connection with method 100, the method may optionally further comprise forming electrical contact features to the membrane resulting from stage 106. For instance, as previously described, the method 100 may be used to form ultrasonic transducers in which the membrane(s) overlying the cavities of the first wafer may be suitably controlled to emit ultrasound signals and/or to receive ultrasound signals and provide an output electrical signal. In such embodiments, it may be desirable to make electrical contact to the membrane to control operation of the ultrasonic transducer or receive/track the behavior of the membrane.

Electrical contact features for the membrane of an ultrasonic transducer may take any suitable configuration. According to a non-limiting embodiment, electrodes (e.g., formed of metal or other suitable conductive material) may be formed on the membranes. The electrodes may be aluminum or any other suitably conductive material. In some embodiments, depending on the type of material used for the electrodes, an interface layer, such as another metal, may also be used. For example, an interface layer of TiN may first be deposited, on top of which the aluminum may be deposited as an electrode. Non-limiting examples are illustrated in FIGS. 6A-6C.

Figure 6A:
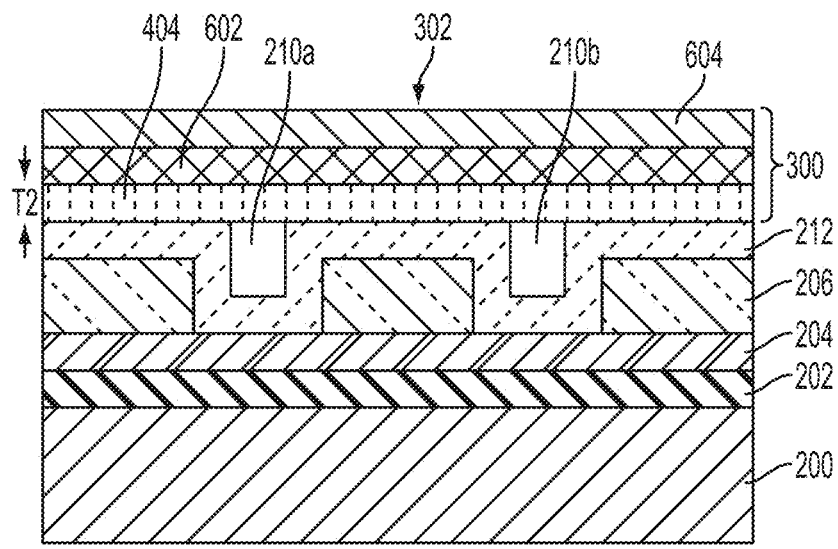
FIGS. 6A-6C illustrate the structures of FIGS. 5A-5C, respectively, with the addition of conductive layers on the membrane.

FIG. 6A illustrates the structure of FIG. 5A with the addition of two conductive layers 602 and 604 over the degeneratively doped layer 404. Conductive layer 604 may be an electrode layer, for example being formed of a metal such as aluminum. Conductive layer 602 may be an interface layer, for example being formed of TiN. Conductive layers 602 and 604 may have any suitable thicknesses.

Figure 6B:
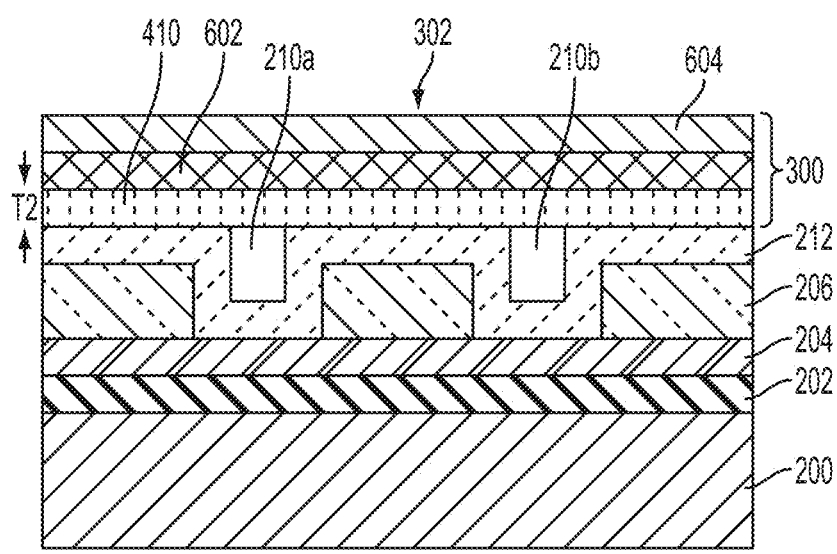
Figure 6C:
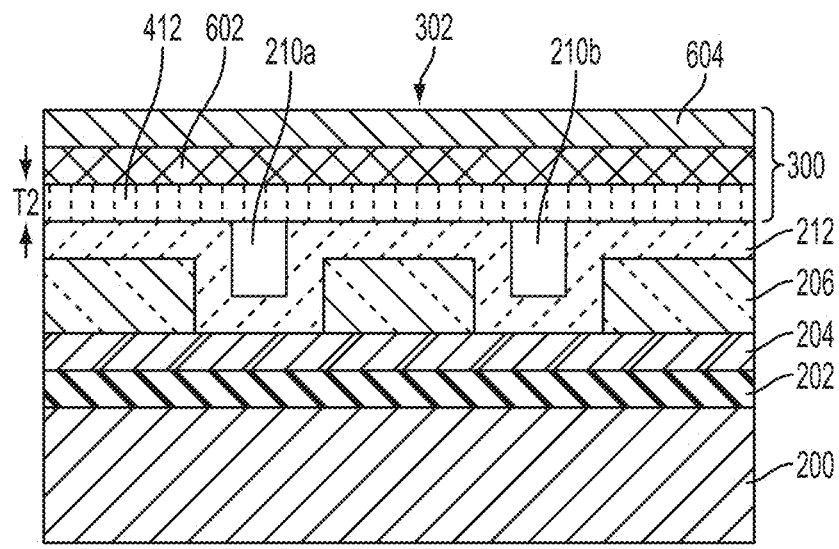

FIG. 6B illustrates the structure of FIG. 5B with the addition of conductive layers 602 and 604. Likewise, FIG. 6C illustrates the structure of FIG. 5C with the addition of conductive layers 602 and 604.

According to an embodiment, the metal electrode (e.g., conductive layer 604) may be common to two or more (and in some cases, many more, including all) membranes on a wafer. For example, as shown in FIGS. 6A-6C, conductive layers 602 and 604 may overlie both cavity 210a and 210b. Such an electrode may function to provide a common potential (e.g., ground potential) to all the membranes. Other configurations are also possible.

Electrical contact to the conductive layers 602 and/or 604 may be provided in any suitable manner. A non-limiting example of a manner of making electrical contact to a metal layer on a membrane is described below in connection with FIGS. 7A-7I. In those embodiments in which a passivation layer is formed on the membrane(s), making electrical contact to the membrane may involve opening contact holes in the passivation layer, creating bond pads, and depositing a suitable contact material.

In some embodiments, an etch through the silicon may be performed to make contact to the underlying aluminum. A non-limiting example is illustrated in connection with FIGS. 7A-7I.

Various sealed cavity structures may be formed using the above-described methodology, and the structures illustrated in FIGS. 5A-5C are non-limiting examples.

Figure 7C:
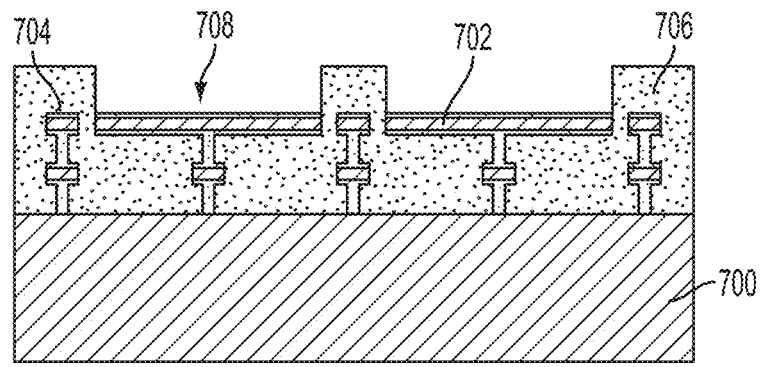

FIGS. 7A-7I illustrate a non-limiting process of fabricating a membrane covering one or more cavities and making electrical contact to a top side of the membrane. Referring to FIG. 7A, the starting point for the process may be a structure including a bulk wafer 700, such as a bulk silicon wafer, having electrode structure 702 and conductive pillars 704 in an insulating material 706, such as $SiO_2$. The insulating material 706 may represent a combination of insulating layers formed over multiple processing stages. For example, insulating material 706 may include one or more interlayer dielectric (ILD) and/or SiO2 deposited by high density plasma (HDP) deposition.

Two electrode structures 702 are illustrated, with one corresponding to each of two cavities to be formed at a later stage of processing. It should be appreciated that any suitable number of electrode structures 702 may be included. The electrode structures 702 may have any suitable configuration and be formed of any suitable material(s). In the non-limiting example shown, as elaborated in the detail of FIG. 7J, the electrode structures 702 and the upper portion of the conductive pillars 704 may have a three-layered structure including top and bottom layers of TiN sandwiching a layer of aluminum, copper, or other suitable conductive material.

Three conductive pillars 704 are shown. They may be used to provide electrical contact to a membrane formed at a later processing stage. The conductive pillars 704 may have any suitable configuration and be formed of any suitable material(s). In the non-limiting example illustrated, and as elaborated in FIG. 7J, the conductive pillars 704 may include a three-layer structure like that used for the electrode structure 702, for example including top and bottom layers of TiN sandwiching a layer of aluminum, copper, or other suitable conductive material. However, other configurations are possible.

In FIG. 7B, the wafer of FIG. 7A may be planarized and polished, for example using CMP. Such planarization and polishing may facilitate subsequent formation of cavities in the wafer, as shown in FIG. 7C.

Referring to FIG. 7C, one or more cavities 708 may be formed in the first wafer. For example, a cavity 708 may be etched from the insulating material 706. The etch may be a selective etch which stops on the electrode structure 702, for example stopping on the TiN layer of the electrode structure 702.

While two cavities 708 are illustrated in FIG. 7C, it should again be appreciated that any suitable number of cavities may be formed, including one or more (e.g., tens of cavities, hundreds of cavities, thousands of cavities, or more). The cavities 708 may have any suitable shapes and dimensions, including any of those described herein for cavities.

Figure 7D:
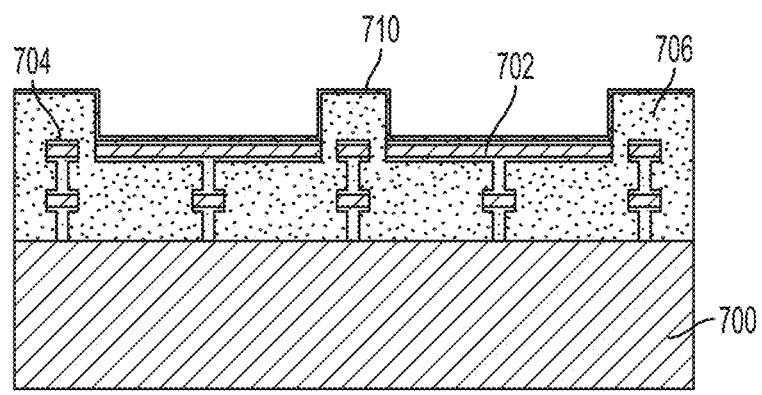

An insulating layer 710 may then be deposited in a conformal deposition stage as shown in FIG. 7D. The insulating layer 710 may be $SiO_2$, or any other suitable insulating material. The insulating material may be used in subsequent direct bonding, as a non-limiting example, and thus may be selected to provide good direct bonding capability with another material. The surface of the wafer may optionally be polished after deposition of the insulating layer 710.

Figure 7E:
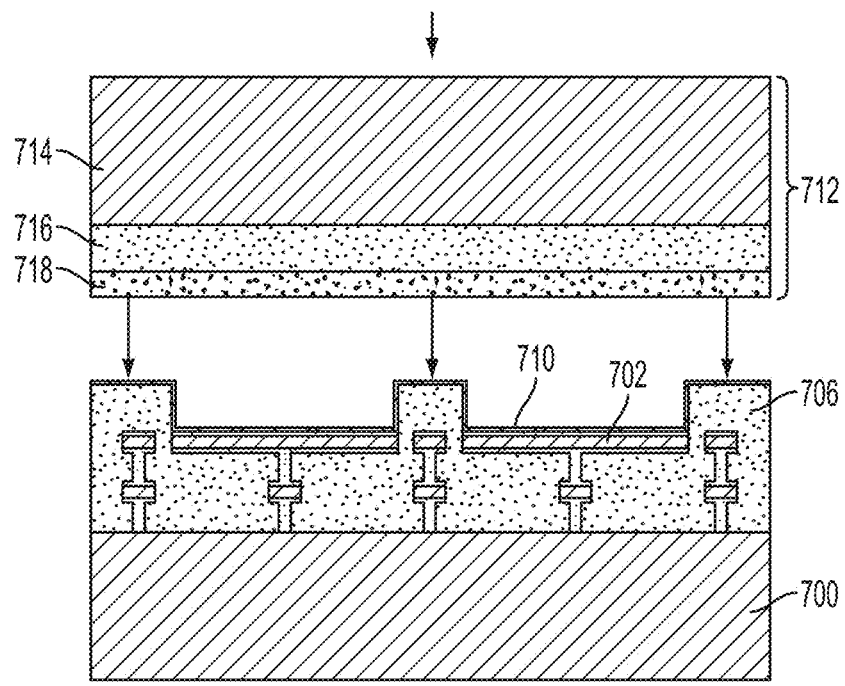

As shown in FIG. 7E, the first wafer may then be bonded to a second wafer 712. As previously described, the second wafer may be one of various suitable types. In the non-limiting example of FIG. 7E, the second wafer 712 comprises three layers 714, 716, and 718. Layer 714 may represent a bulk wafer (e.g., a bulk Si wafer). Layer 716 may represent an insulating layer, such as $SiO_2$. Layer 718 may represent silicon, amorphous silicon, polysilicon, or any other suitable material for forming a membrane to cover the cavities 708 as part of an ultrasonic transducer. The layer 718 may be degeneratively doped (e.g., with P+).

The first wafer and second wafer 712 may be bonded as shown in FIG. 7E using any suitable bonding techniques, including any of those described herein. For instance, low temperature direct bonding may be used, under vacuum, air, or oxygen rich air. In some embodiments, a direct bond of Si—$SiO_2$ may be formed. For example, layer 718 may be Si and insulating layer 710 may be $SiO_2$. A low temperature anneal may then be performed.

Figure 7F:
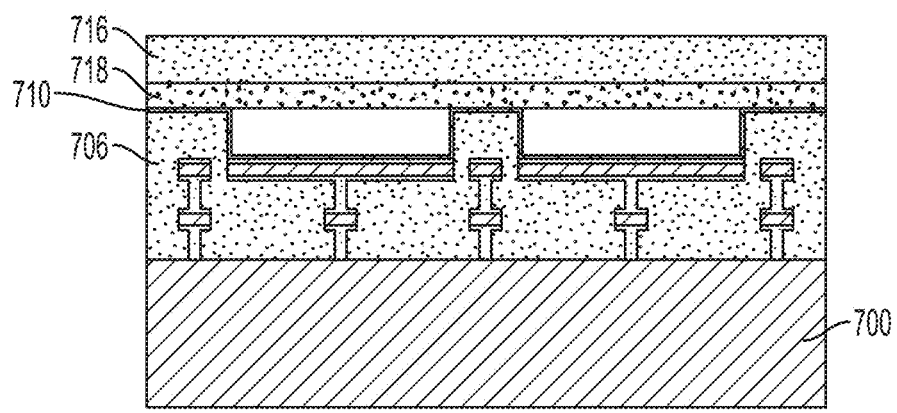

As shown in FIG. 7F, the layer 714 may then be removed, for example by grinding, etching, a combination of the two, or any other suitable technique. The grinding and/or etching performed at the stage illustrated in FIG. 7F may stop on the layer 716, which may be an oxide (e.g., $SiO_2$) and may function as an etch stop.

Figure 7G:
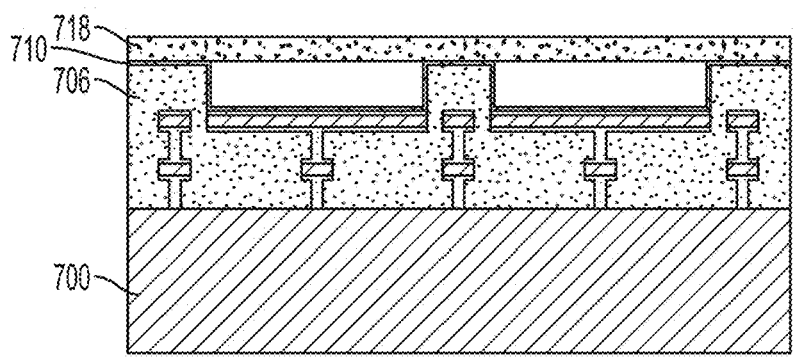

As shown in FIG. 7G, the layer 716 may then be removed, for example using a suitable stripping process (e.g., suitable for stripping oxide in those embodiments in which the layer 716 is an oxide layer). Optionally, the second wafer may then be polished and/or passivated using any suitable passivation material.

Figure 7H:
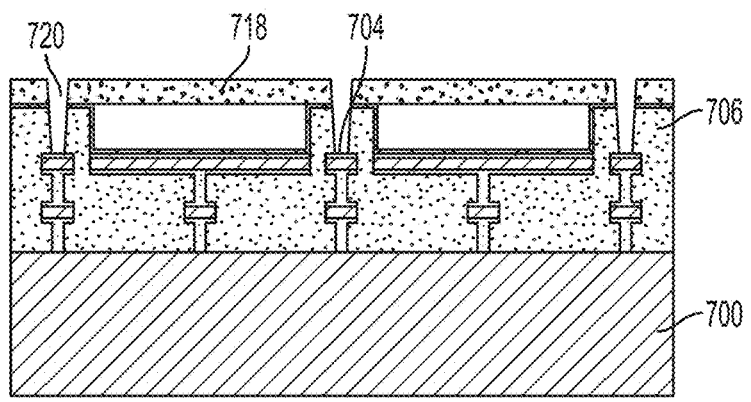

As shown in FIG. 7H, openings 720 (which may be referred to herein as "cuts" or via holes in some embodiments) may then be formed through the layer 718 and at least partially through the insulating material 706 to provide access to the conductive pillars 704. The openings may represent trenches in some embodiments, and may have sloped or vertical sidewalls. Formation of the openings 720 may be a multi-stage process. For example, initially openings may be formed in layer 718, stopping on the insulating material 706. For example, a selective etch selective for Si and non-selective for $SiO_2$ may be used in those embodiments in which layer 718 is a silicon layer and insulating material 706 is $SiO_2$. Another etch may then be performed to etch through the insulating material 706 to the conductive pillars 704. Such an etch may be selective for the insulating material 706 and may be non-selective for the material of conductive pillar 704, such that the conductive pillar 704 may function as an etch stop. In a non-limiting embodiment, the insulating material 706 may be $SiO_2$ and conductive pillar 704 may comprise a layer of TiN, such that a selective etch which is non-selective for TiN may be used, stopping on the TiN as an etch stop. Thus, forming the openings 720 as shown in FIG. 7H may involve using multiple different etch chemistries.

Figure 7I:
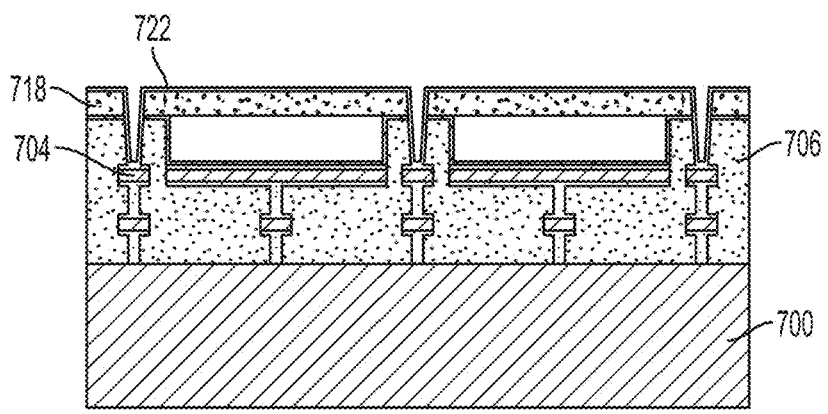

As shown in FIG. 7I, a conductive material 722 may then be deposited, and may cover the sidewalls of the openings 720 and the layer 718. In this manner, electrical contact may be provided from the conductive pillars 704 to an upper surface of the layer 718. In some embodiments, the structure of FIG. 7I may represent an ultrasonic transducer, with layer 718 functioning as a membrane. Thus, electrical contact for controlling membrane operation and/or receiving electrical signals caused by vibration of the membrane may be provided via the conductive pillars 704. In some embodiments, the layer 718 may optionally include one or more additional conductive layers formed thereon.

The conductive material 722 may be any suitable conductive material for providing electrical contact to the layer 718. For example, the conductive material 722 may be TiN in a non-limiting embodiment.

Optionally, the openings 720 may be substantially or completely filled with conductive material. When such filling is performed, the filling material may be tungsten, cobalt, or any other suitable conductive material. Thus, the openings 720 may be filled to form filled vias in some embodiments.

According to an aspect of the present application, a CUT may lack metallization (e.g., an electrode) on the membrane of the CUT. Such a configuration may be advantageous to simplify formation of the CUT and/or to improve performance of the CUT. According to a non-limiting embodiment, electrical contact to the membrane of the CUT may be made on the underside of the membrane (e.g., via one or more via holes). The electrical contact may originate from a first wafer and the membrane may be formed from a second wafer.

The processes described herein may be used to form a CUT lacking metallization on the membrane. The processes may be applied using any of the types of second wafers previously described herein, including bulk silicon wafers, SOI wafers, wafers having a polysilicon layer on an insulator, and wafers having amorphous silicon on an insulator. Exemplary process flows are described in connection with FIGS. 8A-8K and FIGS. 9A-9J, below.

Several structural features shown in FIGS. 8A-8K and 9A-9J have been previously shown and described in connection with FIGS. 7A-7J, and thus are not described again in detail here. Referring first to FIG. 8J, a CMOS ultrasonic transducer (CUT) lacking metallization on a membrane of the CUT is shown. The CUT 808 comprises two electrode structures 702 proximate corresponding cavities 806, which are covered by layer 718. Conductive pillars 704 provide electrical connection to a bottom side (or underside) of the layer 718 proximate the cavities 806. This is to be distinguished from the configuration of FIG. 7I in which electrical contact is provided between the conductive pillars 704 and the topside (or upper surface) of the layer 718 distal the cavities.

A process for forming the CUT 808 may begin as shown in FIG. 8A which is identical to previously described FIG. 7A. FIG. 8K is identical to previously described FIG. 7J. The process may proceed as shown in FIG. 8B, which is identical to previously described FIG. 7B. During the stage of FIG. 8B, an optional strip may be performed to remove the insulating material down to the electrode structures 702 and/or conductive pillars 704. For example, if the insulating material 706 is an oxide, an optional oxide strip may be performed to remove the oxide down to the electrode structures 702 and/or conductive pillars 704.

Figure 8C:
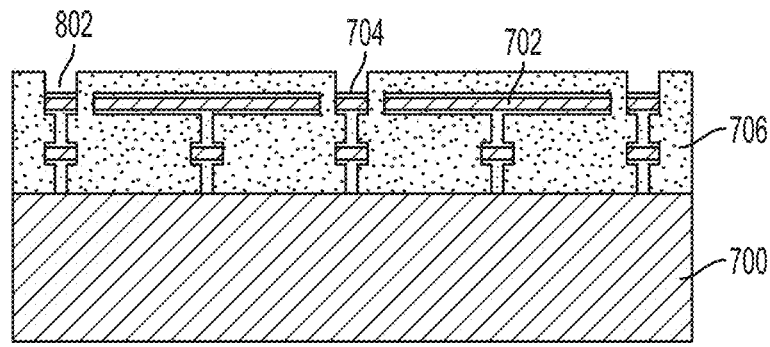

As shown in FIG. 8C, the fabrication process may proceed with the formation of openings 802 (or cuts) in the insulating material 706 to provide access to the conductive pillars 704. The openings 802 may be formed with a suitable etch, which may use the conductive pillars 704 as an etch stop. For example, the insulating material 706 may be $SiO_2$ and the conductive pillars 704 may include TiN, and openings 802 may be formed with a selective etch which stops on the TiN of the conductive pillars 704.

Optionally, the openings 802 may be filled with conductive plugs, for example formed of tungsten, cobalt, or other suitable conductive plug material. When implemented, such an optional process step may involve depositing the conductive material to fill the openings 802 and then patterning the conductive material to confine the plugs to the openings 802.

Figure 8D:
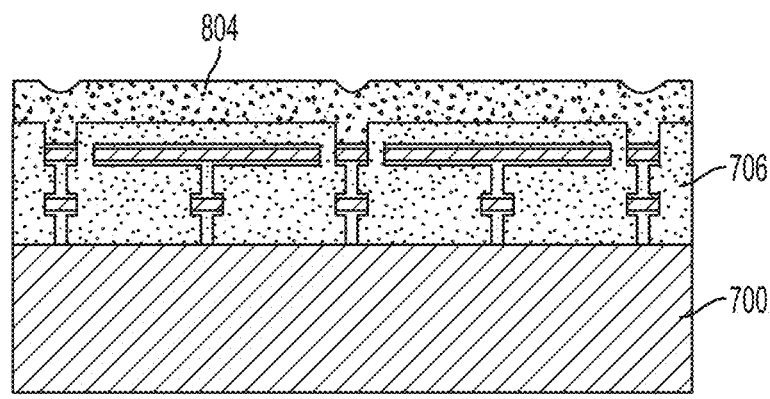

In FIG. 8D, a layer 804 may be deposited. The layer 804 may be formed of silicon, for example amorphous silicon or polysilicon, as non-limiting examples. The layer 804 may be deposited by low pressure chemical vapor deposition (LP-CVD) or in any other suitable manner.

Figure 8E:
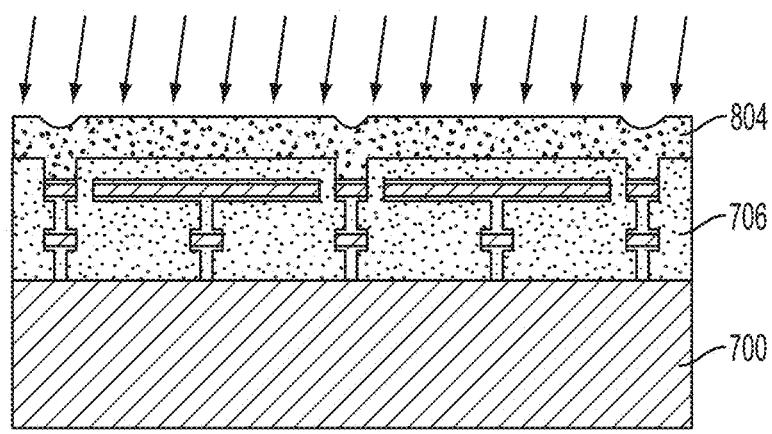

Subsequently, in FIG. 8E, the layer 804 may be doped, with N+ or P+ dopant, as indicated by the arrows. The doping may be performed by ion implantation. An anneal may then be performed, such as a rapid thermal anneal (RTA) or laser anneal.

Figure 8F:
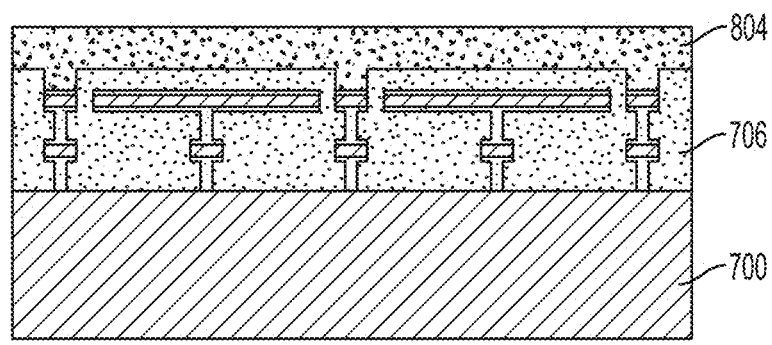

As shown in FIG. 8F, the structure may then be planarized, for example by CMP or other suitable planarization technique.

Figure 8G:
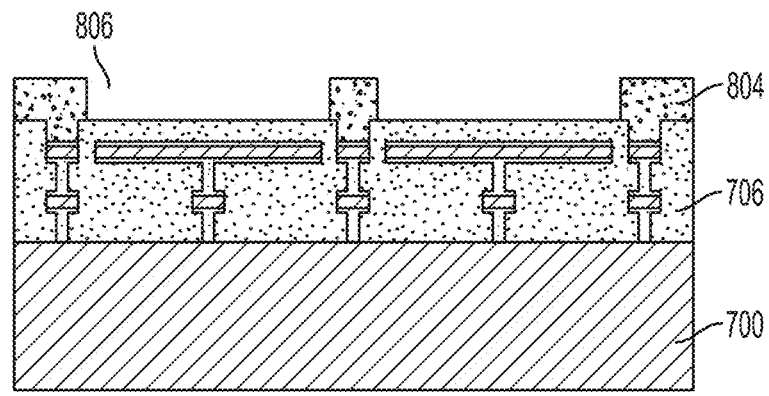

As shown in FIG. 8G, cavities 806 may then be formed in the layer 804, for example using a suitable etch. In a non-limiting embodiment, a selective etch may be used and may use insulating material 706 as an etch stop. For example, the layer 804 may be a silicon layer and the insulating material 706 may be $SiO_2$, and the cavities 806 may be formed by using a selective etch which is non-selective for $SiO_2$.

Figure 8H:
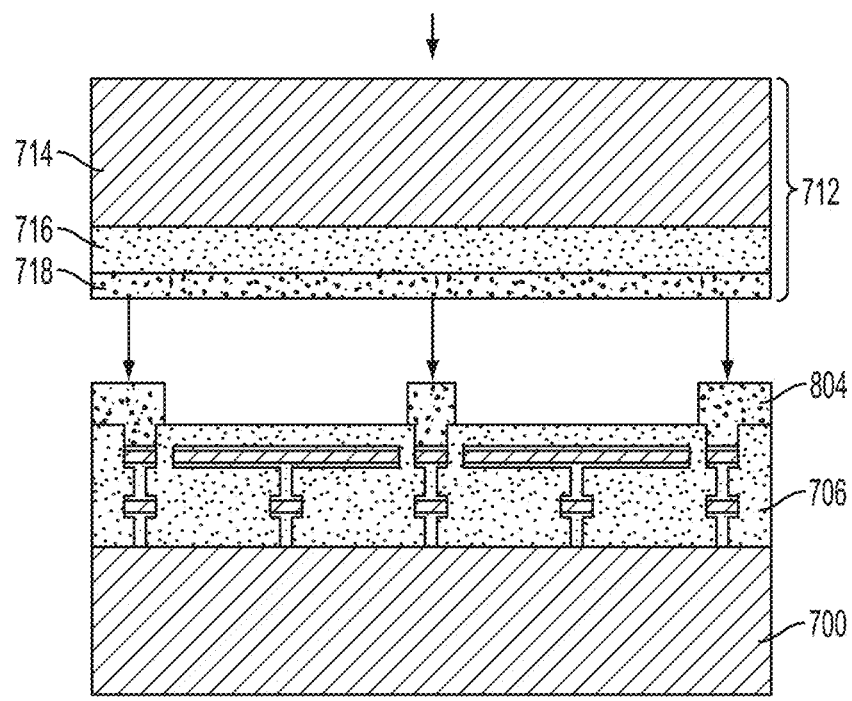

As shown in FIG. 8H, the second wafer 712 may then be bonded with the first wafer using any of the bonding techniques described herein, including direct bonding. According to a non-limiting embodiment, the layer 718 may be a silicon layer and the layer 804 may be a silicon layer, such that a direct Si—Si bond may be formed using a low temperature process. As previously described, the layer 804 may be doped, and in some embodiments the layer 718 may be doped with the same dopant species to facilitate bonding. The bonding may be performed under vacuum, air, or oxygen rich air, as non-limiting examples.

Figure 8I:
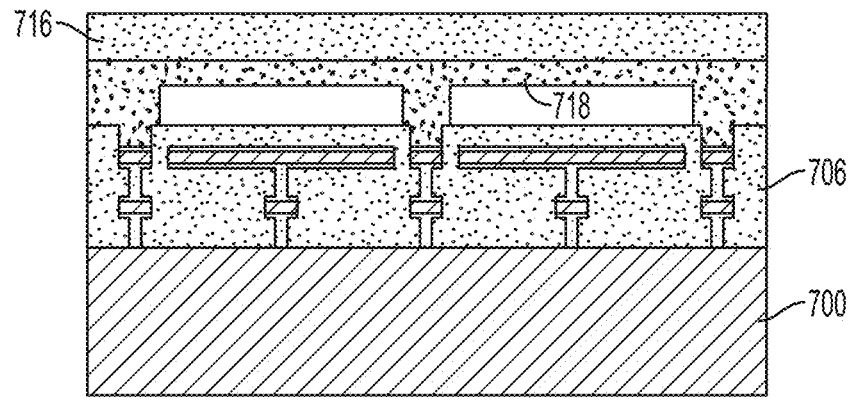
Figure 8J:
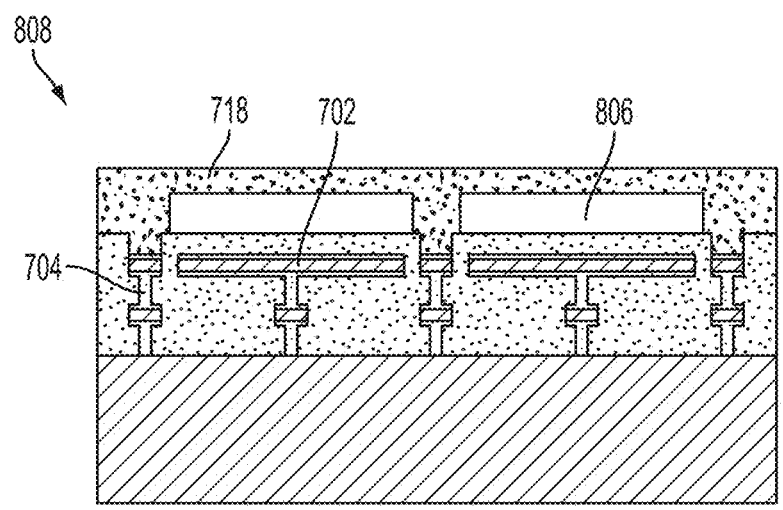

As shown in FIG. 8I, the second wafer 712 may be thinned, in any of the manners described herein. For example, an anneal may be performed. Grinding and polishing may then be performed to reach the layer 716 (e.g., a layer of $SiO_2$).

The layer 716 may then be removed in FIG. 8J in any suitable manner. Optionally, the layer 718 may be polished and/or passivated using any suitable passivation material.

Figure 9D:
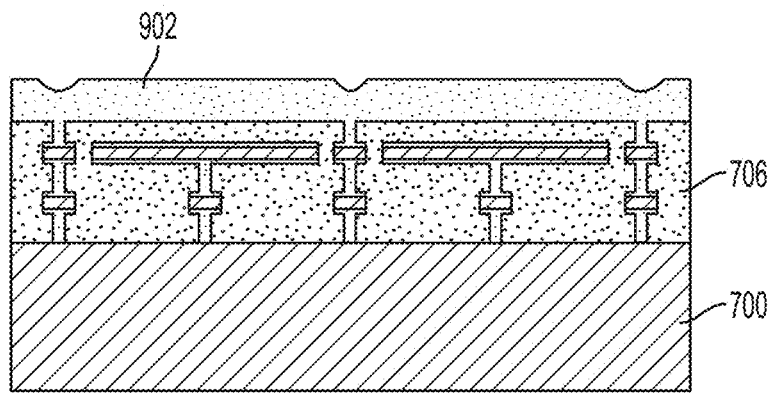

FIGS. 9A-9J illustrate an alternative process to that of FIGS. 8A-8K for fabricating a CUT having an electrical connection to the bottom side of a membrane covering one or more cavities. Structures previously shown and described in connection with FIGS. 7A-7J and 8A-8K are not described in detail again here. For example, FIG. 9A is identical to FIGS. 7A and 8A and therefore not described in detail here. FIG. 9B is identical to previously described FIG. 8B. FIG. 9C is identical to previously described FIG. 8C. FIG. 9J is identical to previously described FIG. 7J.

As shown in FIG. 9D, a conductive layer 902 may be deposited in a conformal deposition step to fill the openings 802 and cover the insulating material 706. The conductive layer 902 may be TiN or any other suitable conductive material (e.g., a metal).

Figure 9E:
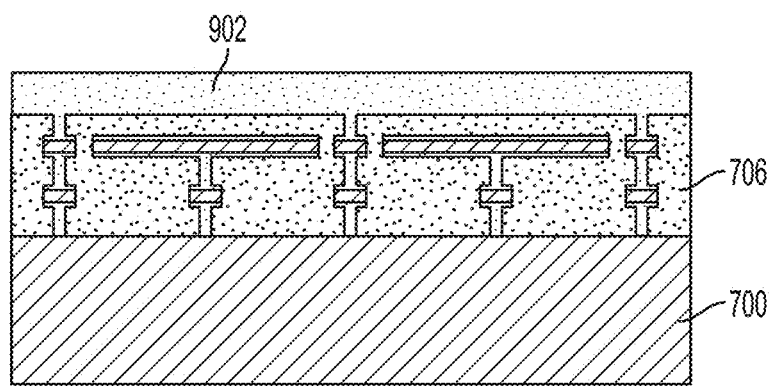

The structure may then be planarized as shown in FIG. 9E. For example, CMP or other suitable planarization technique may be implemented.

Figure 9F:
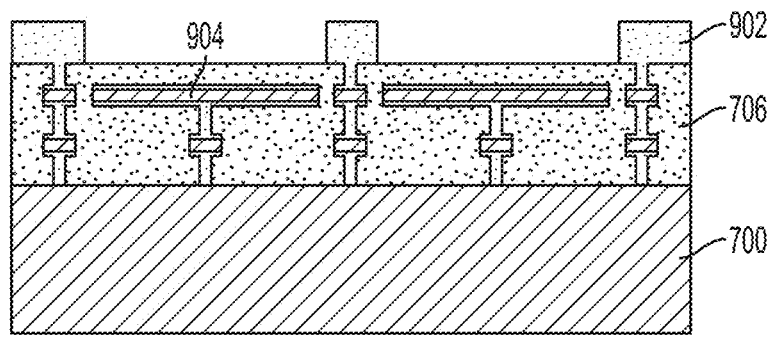

One or more cavities 904 may then be formed as shown in FIG. 9F. The cavities 904 may be formed by etching, for example using a selective etch that is selective for the material of layer 904 and non-selective for the insulating material 706 (e.g., $SiO_2$).

Figure 9G:
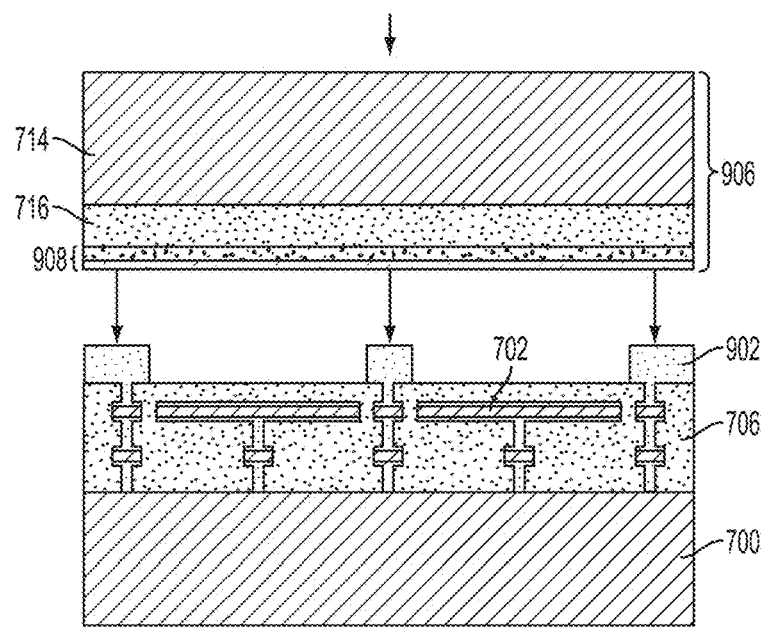

As shown in FIG. 9G, a second wafer 906 may then be bonded with the first wafer. The second wafer may be similar to wafer 712 previously described, including layers 714 and 716. The second wafer 906 may also include a layer 908 which may be similar to previously described layer 718 but which may include a liner. For example, the layer 908 may be a silicon layer with a TiN liner. The liner may be chosen to facilitate direct bonding to the conductive layer 902, for example by making the liner of layer 908 the same material as the material of conductive layer 902.

The bonding illustrated in FIG. 9G may be a direct bond process, such as a low temperature direct bonding of TiN—TiN. The bonding may be performed under vacuum, air, or oxygen rich air as non-limiting examples.

Figure 9H:
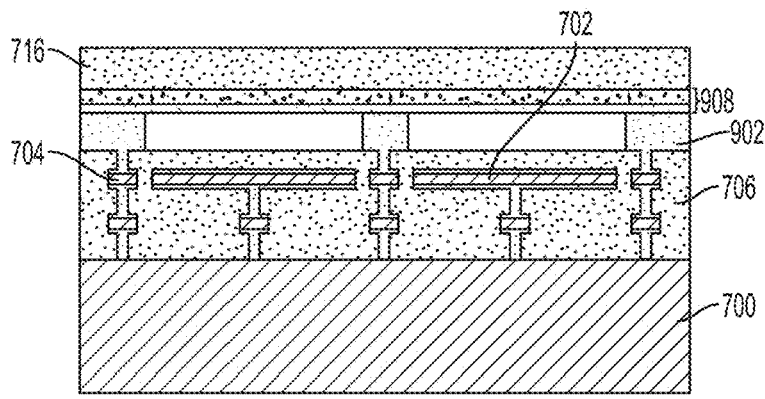

As shown in FIG. 9H, the second wafer 906 may then be thinned as previously described in connection with FIG. 8I, e.g., by performing an anneal, then grinding and polishing down to the layer 716.

Figure 9I:
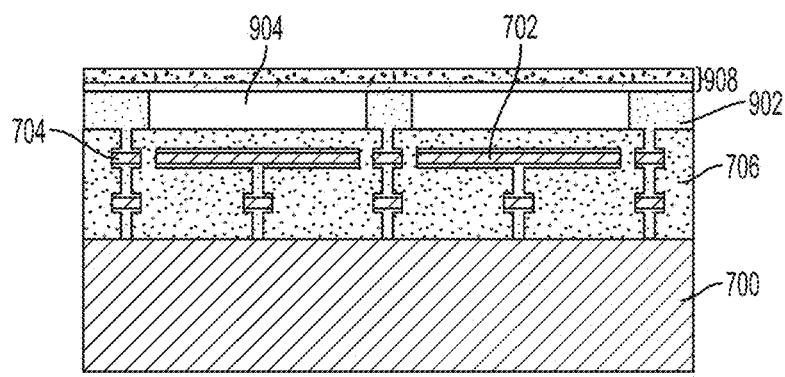

As shown in FIG. 9I, the layer 716 may then be removed using any suitable removal technique. For example, if the layer 716 is an oxide layer, the oxide may be stripped using an oxide etch. Optionally, the structure may be polished and passivated using any suitable passivation material.

Thus, it should be appreciated that the structure of FIG. 9I may provide electrical connection from the conductive pillars 704 to a bottom side of the layer 908 proximate the cavities 904. The layer 908 may serve as a membrane and may be suitably actuated via voltages applied through the conductive pillars 704 and/or may provide electrical signals via the conductive pillars 704 in response to vibration of the membrane. However, it should be noted that the layer 908 need not have any metallization on the top side thereof, which may simplify construction of the CUT and improve performance.

The aspects of the present application may provide one or more benefits, some non-limiting examples of which are now described. It should be appreciated that not all benefits need be provided by all aspects, and that benefits other than those now described may be provided. According to aspects of the present application, methods for fabricating highly integrated devices including CMOS ultrasonic transducers and integrated circuitry (e.g., control circuitry) are provided. The integration of such components may allow for reduction in size of ultrasonic transducers compared to conventional ultrasonic transducers, and may facilitate fabrication of large arrays of ultrasonic transducers. Aspects of the present application provide for methods of fabricating ultrasonic transducers that are scalable to large quantities. Low cost methods may also be provided. Also, arrays of various configurations of ultrasonic transducers may be formed on a wafer, for example including desired variation in membrane size and shape of the ultrasonic transducers on different parts of the wafer. Aspects of the present application provide methods of manufacturing ultrasonic transducers that are compatible with conventional CMOS processing technologies, and thus which may be performed substantially (and in some instances, entirely) in a CMOS fabrication facility.

Aspects of the present application use CUTs as described herein in various types of devices as well. For example, ultrasonic input devices for phones (e.g., smartphones), tablets and computers may include CUTs as described herein, and may be made as low cost ultrasonic input devices in some embodiments. In some embodiments, such ultrasonic devices may allow for sensing the position of hands and fingers over the device. The frequencies of operation may be chosen to be any suitable frequencies (e.g., tuning in the kHz range, such as around 100 khz).

Having thus described several aspects and embodiments of the technology described in the application, it is to be appreciated that various alterations, modifications, and improvements will readily occur to those skilled in the art. Such alterations, modifications, and improvements are intended to be within the spirit and scope of the technology described in the application. For example, those of ordinary skill in the art will readily envision a variety of other means and/or structures for performing the function and/or obtaining the results and/or one or more of the advantages described herein, and each of such variations and/or modifications is deemed to be within the scope of the embodiments described herein. Those skilled in the art will recognize, or be able to ascertain using no more than routine experimentation, many equivalents to the specific embodiments described herein. It is, therefore, to be understood that the foregoing embodiments are presented by way of example only and that, within the scope of the appended claims and equivalents thereto, inventive embodiments may be practiced otherwise than as specifically described. In addition, any combination of two or more features, systems, articles, materials, kits, and/or methods described herein, if such features, systems, articles, materials, kits, and/or methods are not mutually inconsistent, is included within the scope of the present disclosure.

The above-described embodiments can be implemented in any of numerous ways. One or more aspects and embodiments of the present application involving the performance of processes or methods may utilize program instructions executable by a device (e.g., a computer, a processor, or other device) to perform, or control performance of, the processes or methods. In this respect, various inventive concepts may be embodied as a computer readable storage medium (or multiple computer readable storage media) (e.g., a computer memory, one or more floppy discs, compact discs, optical discs, magnetic tapes, flash memories, circuit configurations in Field Programmable Gate Arrays or other semiconductor devices, or other tangible computer storage medium) encoded with one or more programs that, when executed on one or more computers or other processors, perform methods that implement one or more of the various embodiments described above. The computer readable medium or media can be transportable, such that the program or programs stored thereon can be loaded onto one or more different computers or other processors to implement various ones of the aspects described above. In some embodiments, computer readable media may be non-transitory media.

The terms "program" or "software" are used herein in a generic sense to refer to any type of computer code or set of computer-executable instructions that can be employed to program a computer or other processor to implement various aspects as described above. Additionally, it should be appreciated that according to one aspect, one or more computer programs that when executed perform methods of the present application need not reside on a single computer or processor, but may be distributed in a modular fashion among a number of different computers or processors to implement various aspects of the present application.

Computer-executable instructions may be in many forms, such as program modules, executed by one or more computers or other devices. Generally, program modules include routines, programs, objects, components, data structures, etc. that perform particular tasks or implement particular abstract data types. Typically the functionality of the program modules may be combined or distributed as desired in various embodiments.

Also, data structures may be stored in computer-readable media in any suitable form. For simplicity of illustration, data structures may be shown to have fields that are related through location in the data structure. Such relationships may likewise be achieved by assigning storage for the fields with locations in a computer-readable medium that convey relationship between the fields. However, any suitable mechanism may be used to establish a relationship between information in fields of a data structure, including through the use of pointers, tags or other mechanisms that establish relationship between data elements.

When implemented in software, the software code can be executed on any suitable processor or collection of processors, whether provided in a single computer or distributed among multiple computers.

Further, it should be appreciated that a computer may be embodied in any of a number of forms, such as a rack-mounted computer, a desktop computer, a laptop computer, or a tablet computer, as non-limiting examples. Additionally, a computer may be embedded in a device not generally regarded as a computer but with suitable processing capabilities, including a Personal Digital Assistant (PDA), a smart phone or any other suitable portable or fixed electronic device.

Also, a computer may have one or more input and output devices. These devices can be used, among other things, to present a user interface. Examples of output devices that can be used to provide a user interface include printers or display screens for visual presentation of output and speakers or other sound generating devices for audible presentation of output. Examples of input devices that can be used for a user interface include keyboards, and pointing devices, such as mice, touch pads, and digitizing tablets. As another example, a computer may receive input information through speech recognition or in other audible formats.

Such computers may be interconnected by one or more networks in any suitable form, including a local area network or a wide area network, such as an enterprise network, and intelligent network (IN) or the Internet. Such networks may be based on any suitable technology and may operate according to any suitable protocol and may include wireless networks, wired networks or fiber optic networks.

Also, as described, some aspects may be embodied as one or more methods. The acts performed as part of the method may be ordered in any suitable way. Accordingly, embodiments may be constructed in which acts are performed in an order different than illustrated, which may include performing some acts simultaneously, even though shown as sequential acts in illustrative embodiments.

All definitions, as defined and used herein, should be understood to control over dictionary definitions, definitions in documents incorporated by reference, and/or ordinary meanings of the defined terms.

The indefinite articles "a" and "an," as used herein in the specification and in the claims, unless clearly indicated to the contrary, should be understood to mean "at least one."

The phrase "and/or," as used herein in the specification and in the claims, should be understood to mean "either or both" of the elements so conjoined, i.e., elements that are conjunctively present in some cases and disjunctively present in other cases. Multiple elements listed with "and/or" should be construed in the same fashion, i.e., "one or more" of the elements so conjoined. Other elements may optionally be present other than the elements specifically identified by the "and/or" clause, whether related or unrelated to those elements specifically identified. Thus, as a non-limiting example, a reference to "A and/or B", when used in conjunction with open-ended language such as "comprising" can refer, in one embodiment, to A only (optionally including elements other than B); in another embodiment, to B only (optionally including elements other than A); in yet another embodiment, to both A and B (optionally including other elements); etc.

As used herein in the specification and in the claims, the phrase "at least one," in reference to a list of one or more elements, should be understood to mean at least one element selected from any one or more of the elements in the list of elements, but not necessarily including at least one of each and every element specifically listed within the list of elements and not excluding any combinations of elements in the list of elements. This definition also allows that elements may optionally be present other than the elements specifically identified within the list of elements to which the phrase "at least one" refers, whether related or unrelated to those elements specifically identified. Thus, as a non-limiting example, "at least one of A and B" (or, equivalently, "at least one of A or B," or, equivalently "at least one of A and/or B") can refer, in one embodiment, to at least one, optionally including more than one, A, with no B present (and optionally including elements other than B); in another embodiment, to at least one, optionally including more than one, B, with no A present (and optionally including elements other than A); in yet another embodiment, to at least one, optionally including more than one, A, and at least one, optionally including more than one, B (and optionally including other elements); etc.

Also, the phraseology and terminology used herein is for the purpose of description and should not be regarded as limiting. The use of "including," "comprising," or "having," "containing," "involving," and variations thereof herein, is meant to encompass the items listed thereafter and equivalents thereof as well as additional items.

In the claims, as well as in the specification above, all transitional phrases such as "comprising," "including," "carrying," "having," "containing," "involving," "holding," "composed of," and the like are to be understood to be open-ended, i.e., to mean including but not limited to. Only the transitional phrases "consisting of" and "consisting essentially of" shall be closed or semi-closed transitional phrases, respectively.

What is claimed is:

1. A method, comprising:
   forming a cavity in a first wafer above an integrated circuit in the first wafer, wherein forming the cavity comprises etching an upper surface of the first wafer down to an etch stop layer of the first wafer;
   directly bonding the first wafer and a second wafer to seal the cavity of the first wafer with the second wafer to form a sealed cavity, wherein the second wafer defines an SOI wafer including a buried insulator layer; and
   forming an ultrasonic transducer membrane from the second wafer, wherein forming the ultrasonic transducer membrane from the second wafer comprises thinning a backside of the second wafer distal the cavity, and wherein thinning the backside of the second wafer comprises etching a base silicon layer of the second wafer until reaching the buried insulator layer.

2. The method of claim 1, wherein etching the base silicon layer further comprises using a selective etch for which the buried insulator layer functions as an etch stop layer of the second wafer.

3. The method of claim 1, wherein the buried insulator layer is $SiO_2$.

4. The method of claim 1, wherein the etch stop layer comprises a metal electrode structure of the first wafer.

5. The method of claim 1, further comprising forming a conductive layer on an insulating layer of the first wafer, wherein forming the cavity comprises etching the conductive layer to the insulating layer such that the insulating layer serves as the etch stop layer.

6. The method of claim 5, wherein the conductive layer is a doped silicon layer.

7. The method of claim 5, wherein the conductive layer is a metal layer.

8. The method of claim 1, wherein the bonding results in a silicon-to-silicon bond between the first and second wafers.

9. A method, comprising:
   forming a cavity in a first wafer above an integrated circuit in the first wafer, wherein forming the cavity comprises etching an upper surface of the first wafer down to an etch stop layer of the first wafer;
   directly bonding the first wafer and a second wafer to seal the cavity of the first wafer with the second wafer to form a sealed cavity, wherein the second wafer comprises a layer of polysilicon proximate the cavity of the first wafer, a layer of silicon, and an insulator between the layer of polysilicon and the layer of silicon; and
   forming an ultrasonic transducer membrane from the second wafer, wherein forming the ultrasonic transducer membrane from the second wafer comprises thinning a backside of the second wafer distal the cavity, and wherein thinning the backside of the second wafer comprises etching the layer of silicon until reaching the insulator.

10. The method of claim 9, wherein etching the layer of silicon until the insulator is reached comprises using a selective etch for which the insulator functions as an etch stop layer of the etch stop layer.

11. The method of claim 10, wherein the insulator is $SiO_2$.

12. A method, comprising:
    forming a cavity in a first wafer above an integrated circuit in the first wafer, wherein forming the cavity comprises etching an upper surface of the first wafer down to an etch stop layer of the first wafer;
    directly bonding the first wafer and a second wafer to seal the cavity of the first wafer with the second wafer to form a sealed cavity, wherein the second wafer comprises a layer of amorphous silicon proximate the cavity of the first wafer, a layer of silicon, and an insulator between the layer of amorphous silicon and the layer of silicon; and
    forming an ultrasonic transducer membrane from the second wafer, wherein forming the ultrasonic transducer membrane from the second wafer comprises thinning a backside of the second wafer distal the cavity, wherein thinning the backside of the second wafer comprises etching the layer of silicon until the insulator is reached.

13. The method of claim 12, wherein the insulator is $SiO_2$.

14. A method, comprising:
    forming a cavity in a first wafer above an integrated circuit in the first wafer, wherein forming the cavity comprises etching an upper surface of the first wafer down to an etch stop layer of the first wafer;
    directly bonding the first wafer and a second wafer to seal the cavity of the first wafer with the second wafer to form a sealed cavity; and
    forming an ultrasonic transducer membrane from the second wafer,
    further comprising forming an oxide layer on the etched first wafer prior to the bonding such that the bonding results in a silicon-to-oxide bond between the first and second wafers.

* * * * *